United States Patent
Choi et al.

(10) Patent No.: US 12,400,691 B2
(45) Date of Patent: Aug. 26, 2025

(54) MEMORY DEVICE AND METHOD FOR TRAINING PER-PIN OPERATION PARAMETERS

(71) Applicant: Samsung Electronics Co., Ltd., Suwon-si (KR)

(72) Inventors: Garam Choi, Suwon-si (KR); Yonghun Kim, Suwon-si (KR); Kihan Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 18/468,227

(22) Filed: Sep. 15, 2023

(65) Prior Publication Data

US 2024/0212725 A1   Jun. 27, 2024

(30) Foreign Application Priority Data

Dec. 21, 2022   (KR) .......................... 10-2022-0181074

(51) Int. Cl.
   *G11C 7/10*   (2006.01)

(52) U.S. Cl.
   CPC .... *G11C 7/1048* (2013.01); *G11C 2207/2254* (2013.01)

(58) Field of Classification Search
   CPC ... G11C 7/1048; G11C 7/1057; G11C 7/1084; G11C 7/1063; G11C 7/1078; G11C 7/1051; G11C 7/1045; G11C 7/222; G11C 2207/2254
   See application file for complete search history.

(56) References Cited

U.S. PATENT DOCUMENTS

| | | | |
|---|---|---|---|
| 7,034,567 B2 | 4/2006 | Jang | |
| 9,368,164 B2* | 6/2016 | Venkatesan | G11C 29/023 |
| 9,824,728 B2 | 11/2017 | Chen et al. | |
| 10,014,039 B2 | 7/2018 | Lee et al. | |
| 10,868,519 B2 | 12/2020 | Gans | |
| 11,127,462 B2* | 9/2021 | Lee | H01L 23/66 |
| 11,217,284 B2 | 1/2022 | Stave | |
| 2012/0099383 A1* | 4/2012 | Kim | G11C 7/1057 |
| | | | 365/189.05 |

(Continued)

OTHER PUBLICATIONS

Koo, et al., "Small-area high-accuracy ODT/OCD by calibration of global on-chip for 512M GDDR5 application", IEEE Custom Integrated Circuits Conference, San Jose, CA, USA, 2009, 717-720.

*Primary Examiner* — Seokjin Kim

(57) ABSTRACT

Provided are a memory device and a method for training per-pin operation parameters. A memory device includes a plurality of on-die termination (ODT) circuits, an impedance control (ZQ) calibration circuit configured to output a first code signal and a second code signal, and a per-pin calibration circuit. The per-pin calibration circuit may be configured to select one signal pin from among the plurality of signal pins, to compare a first input voltage level of the selected signal pin with a second input voltage level of each of the other ones of the plurality of signal pins, to generate a per-pin ODT code signal for each of the plurality of signal pins, to combine the per-pin ODT code signal with the first code signal or the second code signal, and to provide the combined per-pin ODT code signal to the respective ODT circuits.

20 Claims, 27 Drawing Sheets

(56) References Cited

U.S. PATENT DOCUMENTS

| | | | |
|---|---|---|---|
| 2023/0129949 A1* | 4/2023 | Lee ...................... | G11C 29/022 365/189.18 |
| 2023/0142493 A1* | 5/2023 | Kim ..................... | G11C 7/1084 365/189.18 |

* cited by examiner

MEMORY DEVICE AND METHOD FOR TRAINING PER-PIN OPERATION PARAMETERS

CROSS-REFERENCE TO RELATED APPLICATION

This application is based on and claims priority under 35 U.S.C. § 119 to Korean Patent Application No. 10-2022-0181074, filed on Dec. 21, 2022, in the Korean Intellectual Property Office, the disclosure of which is incorporated by reference herein in its entirety.

BACKGROUND

The inventive concept relates to a semiconductor device, and more particularly, to a memory device and a method for training per-pin operation parameters of signal pins.

As the demand for speeding up electronic systems, increasing data capacity, and consuming less power increases, semiconductor memories that provide faster access, store more data, and use less power have been developed. Semiconductor memories are generally controlled by providing commands, addresses, and clock signals to a memory device. A variety of commands, addresses, and clock signals may be provided by, for example, a memory controller. The commands may cause the memory device to perform various memory operations, such as, for example, a read operation for retrieving data from the memory device and a write operation for storing data in the memory device. Data associated with the command may be provided between the memory controller and the memory device at a known timing relative to receipt and/or transmission by the memory device.

To reduce or minimize the transmission time of signals provided between the memory controller and the memory device, the swing width of the signal may be reduced. As the swing width of the signal decreases, the influence of external noise on a semiconductor chip increases, and signal reflection caused by an impedance mismatch may occur at an interface. To solve the impedance mismatch, semiconductor chips may use an impedance adjustment (ZQ) pin, and may calibrate the ZQ using an external resistance connected to the ZQ pin.

The memory controller performs a ZQ calibration operation on signal lines that transmit commands, addresses, and data provided to the memory device. The memory controller provides resistance Ron of an output driver with respect to each of the signal lines by performing the ZQ calibration operation. The memory device provides an on-die termination (ODT) resistance Rtt to a signal pin connected to each of the signal lines by performing the ZQ calibration operation. When the resistance Ron of the memory controller and the resistance Rtt of the memory device are the same, a signal having ideal global input/output (IO) signal characteristics may be carried on signal lines between the memory controller and the memory device.

Meanwhile, the memory device includes a plurality of DQ pins connected to a plurality of data DQ lines among signal lines. The DQ pins of the memory device may have different signaling characteristics (e.g., VIH, VIL, VOH, and VOL) according to their respective environments (e.g., circuit device characteristics and arrangement), and performance of the memory device may be diminished by a DQ pin having bad signaling characteristics.

Accordingly, it may be desirable to reduce differences in the signaling characteristics of DQ pins of the memory device. When the per-pin IO signal characteristic of each of the DQ pins is considered, and such a facility is possible, it may be beneficial to reduce the distribution of signaling characteristics of the DQ pins and improve the performance of the memory device.

SUMMARY

The inventive concept provides a memory device and a method for training per-pin operation parameters of signal pins.

According to an aspect of the inventive concept, there is provided a memory device including a plurality of signal pins, each of the plurality of signal pins being connected to a receiver configured to receive a signal transmitted thereto, a plurality of on-die termination (ODT) circuits configured to respectively provide an ODT resistance to each of the plurality of signal pins, an impedance control (ZQ) calibration circuit configured to output a first code signal and a second code signal for controlling impedance of each of the plurality of signal pins, the first code signal and the second code signal being provided to the respective ODT circuits, and a per-pin calibration circuit configured to select one signal pin from among the plurality of signal pins, to compare a first input voltage level of the selected signal pin with a second input voltage level of each of the other ones of the plurality of signal pins, to generate a per-pin ODT code signal for each of the plurality of signal pins, to combine the per-pin ODT code signal with the first code signal or the second code signal, and to provide the combined per-pin ODT code signal to the respective ODT circuits.

According to another aspect of the inventive concept, there is provided a memory device including a plurality of signal pins, each of the plurality of signal pins being connected to a transmitter configured to transmit a signal to a corresponding signal pin, a plurality of on-die termination (ODT) circuits configured to respectively provide an output driver impedance to each of the plurality of signal pins, an impedance control (ZQ) calibration circuit configured to output a first code signal and a second code signal for controlling the output driver impedance of each of the plurality of signal pins, the first code signal and the second code signal being provided to the respective ODT circuits, and a per-pin calibration circuit configured to select one signal pin from among the plurality of signal pins, to compare a first output voltage level of the selected signal pin with a second output voltage level of each of the other ones of the plurality of signal pins, to generate a per-pin ODT code signal of each of the plurality of signal pins, to combine the per-pin ODT code signal with the first code signal or the second code signal, and to provide the combined per-pin ODT code signal to the respective ODT circuits.

According to another aspect of the inventive concept, there is provided a method of setting operating conditions of a plurality of signal pins including performing an impedance control (ZQ) calibration operation on each of the plurality of signal pins, wherein a pull-up code signal and a pull-down code signal for controlling an impedance of each of the plurality of signal pins are output by the ZQ calibration operation, providing an ODT resistance to each of the plurality of signal pins using a plurality of on-die termination (ODT) circuits connected to each of the plurality of signal pins, selecting one signal pin from among the plurality of signal pins, generating a per-pin ODT code signal for each of the plurality of signal pins by comparing a first input voltage level of the selected signal pin with a second input voltage level of each of the other ones of the plurality of signal pins, in a dither condition in which a result of comparison oscillates between up and down, generating a calculation result code by adding or subtracting the per-pin ODT code signal of each of the plurality of signal pins to or from the pull-up code signal or the pull-down code signal, and providing the calculation result code for each of the plurality of signal pins to the respective ODT circuit of each of the plurality of signal pins.

According to another aspect of the inventive concept, there is provided a method of setting operating conditions of a plurality of signal pins including performing an impedance control (ZQ) calibration operation on each of the plurality of signal pins, wherein a pull-up code signal and a pull-down code signal for controlling an output driver impedance of each of the plurality of signal pins are output by the ZQ calibration operation, providing an output driver impedance of each of the plurality of signal pins using a plurality of on-die termination (ODT) circuits respectively coupled to each of the plurality of signal pins, selecting one signal pin from among the plurality of signal pins, generating a per-pin ODT code signal of each of the plurality of signal pins by comparing a first output voltage level of the selected signal pin with a second output voltage level of each of the other signal pins, in a dither condition in which a result of comparison oscillates between up and down, generating a calculation result code by adding or subtracting the per-pin ODT code signal of each of the plurality of signal pins to or from the pull-up code signal or the pull-down code signal, and providing the calculation result code for each of the plurality of signal pins to the respective ODT circuit of each of the plurality of signal pins.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
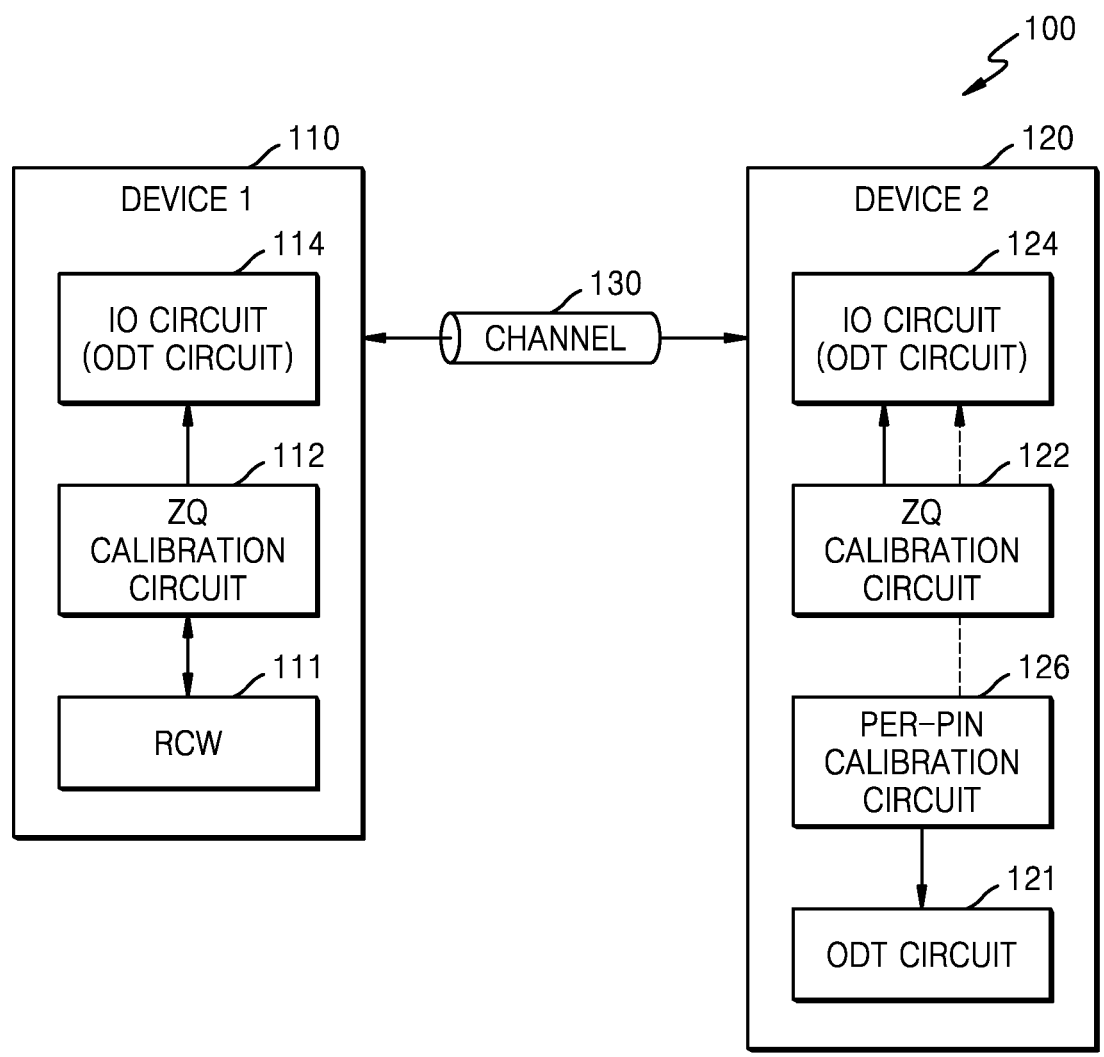
FIG. 1 is a block diagram of an apparatus according to an embodiment.

Hereinafter, embodiments will be described in detail with reference to the accompanying drawings. In this description, like reference numerals may indicate like components. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of an apparatus 100 according to an embodiment.

Referring to FIG. 1, the apparatus 100 includes a first device 110 and a second device 120. The apparatus 100 may be implemented to be included in a personal computer (PC) or a mobile electronic device. The mobile electronic device may be implemented as a laptop computer, a mobile phone, a smart phone, a tablet PC, a personal digital assistant (PDA), an enterprise digital assistant (EDA), a digital still camera, a digital video camera, a portable multimedia player (PMP), a personal navigation device (PND) or a portable navigation device (PND), a handheld game console, a mobile Internet device (MID), a wearable computer, an Internet of Things (IoT) device, an Internet of Everything (IoE) device, or a drone.

The first device 110 may be implemented as an integrated circuit (IC), a system on chip (SoC), an application processor (AP), a mobile AP, a chipset, or a set of chips. As an example, the first device 110 may be a semiconductor device that is configured to perform a memory control function, and may also be included in an AP. The AP may include a memory controller, random-access memory (RAM), a central processing unit (CPU), a graphics processing unit (GPU), and/or a modem.

The second device 120 may be implemented as a memory device. The memory device may be implemented as dynamic RAM (DRAM) or static RAM (SRAM), but embodiments are not limited thereto. For example, the second device 120 may correspond to double data rate synchronous dynamic random access memory (DDR SDRAM), low power DDR (LPDDR) SDRAM, graphics DDR (GDDR) SDRAM, Rambus DRAM (RDRAM), etc. In other embodiments, the second device 120 may be implemented as high bandwidth memory (HBM) or processor-in-memory (PIM).

According to embodiments, the second device 120 may be implemented as a nonvolatile memory device. For example, the second device 120 may be implemented as flash memory or resistive memory, such as phase change RAM (PRAM), magnetic RAM (MRAM), and/or resistive RAM (RRAM). Hereinafter, for convenience of explanation, the first device 110 is referred to as a memory controller and the second device 120 is referred to as a memory device. The memory device 120 is shown as a single semiconductor chip, but may actually include n (n is an integer other than 0, a non-zero whole number) memory devices.

The memory controller 110 and the memory device 120 may communicate via a channel 130. The channel 130 may include a signal line physically or electrically connecting the memory controller 110 to the memory device 120. Ends of the channel 130 may be coupled to the respective pins of the memory controller 110 and the memory device 120. The term "pin" refers broadly to an electrical interconnection to an integrated circuit (IC) and may include, for example, a pad, a ball, or another electrical contact point on the IC. In the drawing, it is shown that a signal is transmitted through one signal line between the memory controller 110 and the memory device 120, but the channel 130 may actually include a clock signal line, a command/address bus, and/or a data bus.

The memory controller 110 may provide a command to the memory device 120 to perform a memory operation. Non-limiting examples of a memory command may include a timing command for controlling the timing of various operations, an access command for accessing memory, e.g., a read command for performing a read operation, and a write command for performing a write operation, a mode register write and read command for performing a mode register write and read operation, etc.

In the operation, when a read command and a related address are provided to the memory device 120 by the memory controller 110, the memory device 120 may receive the read command and the related address, and perform a read operation to output read data from a memory location corresponding to the related address. The read data may be provided to the memory controller 110 by the memory device 120 according to timing related to the reception of the read command. For example, the timing may be based on a read latency (RL) value representing the number of clock cycles after the read command when the read data is provided to the memory controller 110 by the memory device 120. The RL value may be set in the memory device 120 by the memory controller 110. For example, the RL value may be programmed into a mode register set (hereinafter referred to as "MRS") 121 of the memory device 120. As is known, the MRS 121 of the memory device 120 may be programmed with information for setting various operation modes and/or for selecting characteristics for a memory operation. One of such settings may be related to the RL value.

In the operation, when a write command and a related address are provided to the memory device 120 by the memory controller 110, the memory device 120 may receive the write command and the related address, and perform a write operation to write the write data from the memory controller 110 to a memory location corresponding to the related address. The write data is provided to the memory device 120 by the memory controller 110 according to timing related to the reception of the write command. For example, the timing may be based on the WL value representing the number of clock cycles after the write command when the write data is provided to the memory device 120 by the memory controller 110. The WL value may be programmed into the MRS 121 of the memory device 120 by the memory controller 110.

To accurately perform the memory operation according to such operating timings, the memory controller 110 may perform memory training on the memory device 120. Memory training may include memory core parameter training associated with a memory core in the memory device 120 and/or peripheral circuit parameter training on peripheral circuits other than the memory core. The memory controller 110 may be a training subject to determine optimal parameters with respect to a memory core parameter and/or peripheral circuit parameters. According to embodiments, memory training may be performed by the memory device 120 that is a subject.

The memory controller 110 may include a register control word (RCW) 111, a ZQ calibration circuit 112, and an input/output (IO) circuit 114 for controlling the memory device 120 in accordance with the initialization and/or operation characteristics of the memory device 120. The RCW 111 may include various algorithms that configure the memory controller 110 so that the memory controller 110 may interoperate with the memory device 120. For example, codes indicating frequency, timing, driving, and detailed operation parameters of the memory device 120 may be set in the RCW 111. The codes of the RCW 111 may represent a burst length (BL), read latency (RL)/write latency (WL), an SoC On Die Termination (ODT) function, a pull-down/ODT and pull-up/output high level voltage (VOH) calibration, etc.

The BL may be provided to set the maximum number of column locations accessible with respect to read and/or write commands. The RL/WL may be provided to define a clock cycle delay between a read and/or write command and a first bit of valid output and/or input data. The SoC ODT may be provided to satisfy VOH specifications between the memory controller 110 and the memory device 120. The pull-down/ODT and pull-up/Voh calibration may be provided to improve signal integrity (SI) by adjusting the swing width and/or driver strength of signals transmitted over the clock signal line of the channel 130, a command/address bus and/or a data bus.

The memory controller 110 may program the MRS 121 of the memory device 120 by issuing the mode register write command. The MRS 121 may be programmed to set a plurality of operation parameters, options, various functions, characteristics, and modes of the memory device 120, and may be programmed with the same parameter codes as the codes of the RCW 111. That is, the MRS 121 may be programmed according to the codes of the RCW 111.

The IO circuit 114 of the memory controller 110 may transmit a clock signal, a command signal, an address signal, and/or data to the memory device 120 through the channel 130. Also, the IO circuit 114 may receive read data provided by the memory device 120 that has performed the read operation through the channel 130. The ZQ calibration circuit 112 of the memory controller 110 may perform a ZQ calibration operation on signal lines through which the clock signal, the command signal, the address signal, and/or the data are transmitted. The ZQ calibration operation of the memory controller 110 is described in detail with reference to FIG. 2.

Meanwhile, the memory controller 110 may further include a memory PHY connected to the channel 130. The memory PHY may include a physical or electrical layer and a logical layer provided for signals, frequency, timing, driving, detailed operation parameters, and functionality that facilitates efficient communication between the memory controller 110 and the memory device 120. The memory PHY may support features of the DDR and/or LPDDR protocols of the Joint Electron Device Engineering Council (JEDEC) standard.

The memory device 120 may include the MRS 121, the ZQ calibration circuit 122, the IO circuit 124, and a per-pin calibration circuit 126. The MRS 121 may store a parameter code including appropriate bit values provided to the command/address bus of the channel 130 when the mode register write command is issued by the memory controller 110. The MRS 121 may store the BL, the RL/WL, the SoC ODT function, the pull-down/ODT and pull-up/VOH calibration, etc. that are set to be the same as the codes of the RCW 111.

The IO circuit 124 of the memory device 120 may include a receiver that receives the clock signal, the command signal, the address signal, and/or the data transmitted through the channel 130 by the memory controller 110. Also, the IO circuit 124 may include a transmitter that transmits data read from the memory core to the memory controller 110 through the channel 130. The ZQ calibration circuit 122 may perform the ZQ calibration operation of controlling the impedance of each of a plurality of signal pins of the memory device 120. The per-pin calibration circuit 126 of the memory device 120 may be configured to select one signal pin in relation to one operation parameter with respect to the plurality of signal pins, train a per-pin operation parameter of each of the other signal pins to be the same as the operation condition of the selected signal pin, and additionally apply the per-pin operation parameter to the operation parameter.

A per-pin calibration operation of the memory device 120 is described in detail with reference to FIGS. 4 to 18. FIGS. 4 to 9 illustrate operations of reducing an input high level (VIH) distribution of DQ data received by the memory device 120, FIGS. 10A, 10B, 11, and 12 illustrate operations of reducing an input low level (VIL) distribution of DQ data received by the memory device 120, FIGS. 13A, 13B, 14, and 15 illustrate operations of reducing an output high level (VOH) distribution of DQ data transmitted from the memory device 120, and FIGS. 16A, 16B, 17, and 18 illustrate operations of reducing an output low level (VOL) distribution of DQ data transmitted from the memory device 120.

Figure 2:
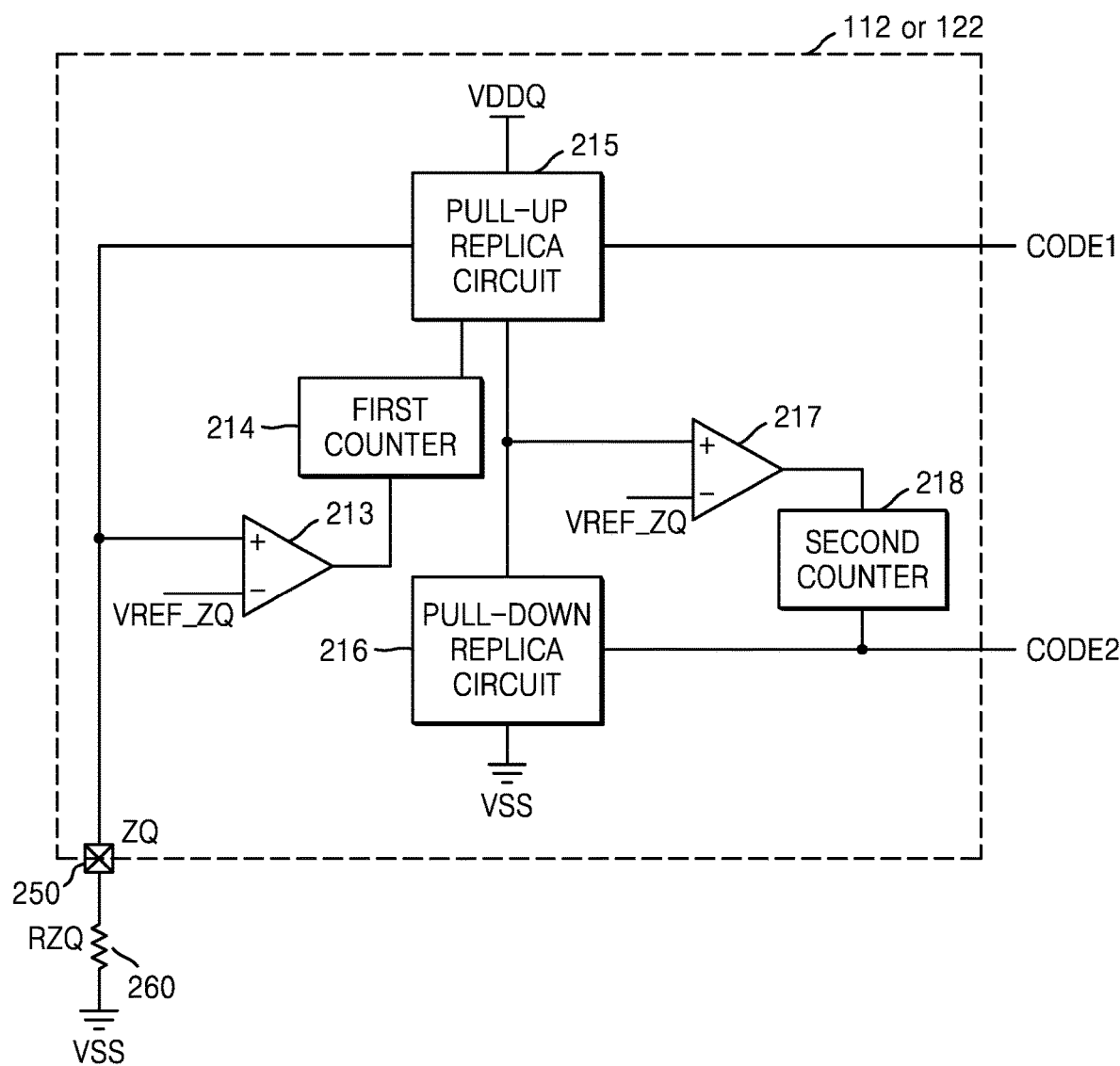
FIG. 2 is a block diagram illustrating an impedance adjustment (ZQ) calibration circuit according to some embodiments.

FIG. 2 is a block diagram illustrating a ZQ calibration circuit according to some embodiments. FIG. 2 is a block diagram illustrating an example of the ZQ calibration circuit 112 of the memory controller 110 of FIG. 1 or the ZQ calibration circuit 122 of the memory device 120.

Referring to FIG. 2, the ZQ calibration circuit 112 or 122 may include a first comparator 213, a first counter 214, a pull-up replica circuit 215, a pull-down replica circuit 216, a second comparator 217, and a second counter 218. The pull-up replica circuit 215 may have substantially the same configuration as a pull-up circuit 310 of FIG. 3, and the pull-down replica circuit 216 may have substantially the same configuration as a pull-down circuit 320 of FIG. 3.

The first comparator 213 may compare the voltage level of the line connected to a ZQ pin 250 with the level of a reference voltage VREF_ZQ, and generate an up/down signal based on a result of comparison. For example, the reference voltage VREF_ZQ may have a voltage level corresponding to half VDDQ/2 of the level of a power supply voltage VDDQ. The first counter 214 may be stepped up or down based on the up/down signal of the first comparator 213 to output a multi-bit count value, that is, a count code. The count code of the first counter 214 may be provided to the pull-up replica circuit 215. As the pull-up replica circuit 215 is swept by the count code, the voltage level of the line connected to the ZQ pin 250 may increase or decrease.

The first comparator 213 may perform a comparison operation until the result of comparison between the voltage level of the line connected to the ZQ pin 250 and the level of the reference voltage VREF_ZQ is the same or within a certain threshold value. The first comparator 213 may perform a comparison operation until the first counter 214 enters a dither condition in which the first counter 214 oscillates between stepped up and down. When the result of comparison is the same or within a certain value and/or the first counter 214 reaches the dither condition, the count code of the first counter 214 may be provided as a first code signal CODE1 of the pull-up replica circuit 215. The pull-up termination resistance of the pull-up replica circuit 215 may be adjusted by the first code signal CODE1.

The pull-up replica circuit 215 may be connected to the pull-down replica circuit 216. The second comparator 217 may compare the voltage level of the connection node between the pull-up replica circuit 215 and the pull-down replica circuit 216 with the level of the reference voltage VREF_ZQ, and may generate the up/down signal based on a result of the comparison. The second counter 218 may step up or down based on the up/down signal of the second comparator 217 to output a count code. The count code of the second counter 218 may be provided to the pull-down replica circuit 216, and the pull-down replica circuit 216 may be swept by the count code of the second counter 218.

Figure 3:
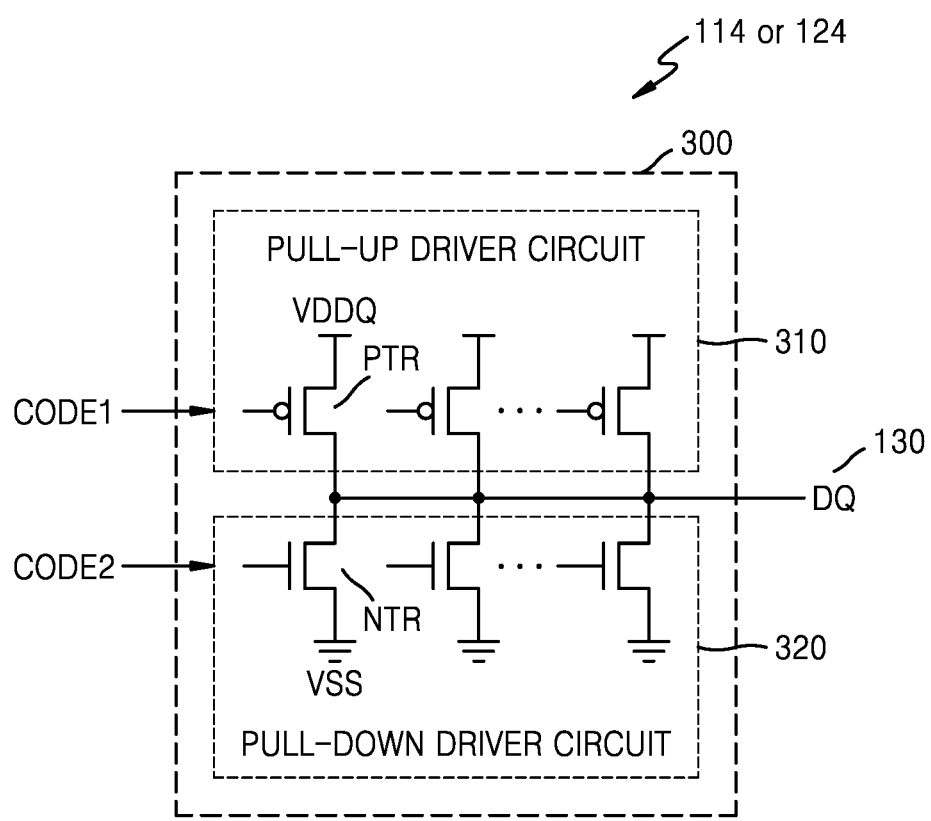
FIG. 3 is a circuit diagram illustrating an input/output (IO) circuit according to some embodiments.

The pull-down replica circuit 216 may have substantially the same configuration as the pull-down circuit 320 of FIG. 3. The pull-down replica circuit 216 may perform a pull-down calibration operation until the voltage level of the connection node between the pull-up replica circuit 215 and the pull-down replica circuit 216 is the same as the level of the reference voltage VREF_ZQ by the second comparator 217 and the second counter 218. When the voltage level of the connection node between the pull-up replica circuit 215 and the pull-down replica circuit 216 is the same as the level of the reference voltage VREF_ZQ, the count code of the second counter 218 may be provided as a second code signal CODE2. The pull-down termination resistance of the pull-down replica circuit 216 may be adjusted by the second code signal CODE2.

FIG. 3 is a circuit diagram illustrating an IO circuit according to some embodiments. FIG. 3 is a circuit diagram of the IO circuit 114 of the memory controller 110 of FIG. 1 or the IO circuit 124 of the memory device 120, and an example of an output driver circuit included in the IO circuit 114 or 124.

Referring to FIG. 3, the IO circuit 114 or 124 may include an output driver circuit 300 connected to the DQ line of the channel 130. The output driver circuit 300 may provide a termination resistance value of the DQ pin based on the first and second code signals CODE1 and CODE2 provided from the ZQ calibration circuit 112 or 122. The output driver circuit 300 may include a pull-up circuit 310 connected between the power supply voltage VDDQ line and the DQ pin, and a pull-down circuit 320 connected between the DQ pin and a ground voltage VSS line.

The pull-up circuit 310 may include a plurality of PMOS transistors PTR connected between the power supply voltage VDDQ line and the DQ pin and arranged in parallel. Each of the plurality of PMOS transistors PTR may be turned on or off in response to the first code signal CODE1 of n bits corresponding thereto. According to an embodiment, size ratios of the plurality of PMOS transistors PTR related to transistor widths may be the same or different. A resistance value of each of the plurality of PMOS transistors PTR according to the on/off state according to the first code signal CODE1 may be provided as a pull-up termination resistor RU (FIG. 4) of the DQ pin.

The pull-down circuit 320 may include a plurality of NMOS transistors NTR connected between the DQ pin and the ground voltage VSS line and arranged in parallel. Each of the NMOS transistors NTR may be turned on or off in response to the second code signal CODE2 of n bits corresponding thereto. According to an embodiment, size ratios of the plurality of NMOS transistors NTR related to transistor widths may be the same or different. A resistance value of each of the plurality of NMOS transistors NTR according to the on/off state may be provided as a pull-down termination resistor RD (FIG. 4) of the DQ pin.

In FIG. 3, the pull-up circuit 310 includes PMOS transistors, and the pull-down circuit 320 includes NMOS transistors, but embodiments of the inventive concept are not necessarily limited thereto. As an example, each of the pull-up circuit 310 and the pull-down circuit 320 may include NMOS transistors or PMOS transistors. As another example, each of the pull-up circuit 310 and the pull-down circuit 320 may include both NMOS transistors and PMOS transistors in consideration of operation characteristics of the transistors.

Meanwhile, the output driver circuit 300 included in the IO circuit 124 may transmit data DQ through the DQ pin. The first code signal CODE1 and the second code signal CODE2 for outputting a corresponding logic level of the data DQ to the DQ pin may be provided to the output driver circuit 300. The PMOS transistors PTR of the pull-up circuit 310 may be turned on or off in response to the first code signal CODE1. The PMOS transistors PTR corresponding to a bit value "0" of the first code signal CODE1 may be turned on so that the DQ pin may be driven to a logic high level. The NMOS transistors NTR of the pull-down circuit 320 may be turned on or off in response to the second code signal CODE2. NMOS transistors corresponding to a bit value "1" of the second code signal CODE2 may be turned on so that the DQ pin may be driven to a logic low level.

In the IO circuit 124, as the code value of the first code signal CODE1 decreases by −1, the output intensity of the output driver circuit 300 increases, and thus, the logic high output level of the DQ pin may increase, and as the code value of the first code signal CODE1 increases by +1, the output intensity of the output driver circuit 300 decreases, and thus, the logic high output level of the DQ pin may decrease. In the IO circuit 124, as the code value of the second code signal CODE2 decreases by −1, the output intensity of the output driver circuit 300 decreases, and thus, the logic low output level of the DQ pin may increase, and as the code value of the second code signal CODE2 increases by +1, the output intensity of the output driver circuit 300 increases, and thus, the logic low output level of the DQ pin may decrease. Accordingly, the output voltage levels VOH and VOL of the DQ pin may be adjusted by the first and second code signals CODE1 and CODE2, which is described with reference to FIGS. 13A to 15 and 16A to 18.

As described above, the I/O circuit 114 or 124 may provide the pull-up termination resistance RU (FIG. 4) of the DQ pin based on the first code signal CODE and may provide the pull-down termination resistor RD (FIG. 4) of the DQ pin based on the second code signal CODE2. In consideration of the function of the I/O circuit 114 or 124 to provide the ODT resistance of each of the memory controller 110 and the memory device 120, the I/O circuit 114 or 124 may be referred to as the ODT circuit 114 or 124. In addition, in consideration of the function of the I/O circuit 114 or 124 to transmit the data DQ between the memory controller 110 and the memory device 120, the I/O circuit 114 or 124 may also be referred to as a transmitter 410 (FIG. 4) and a receiver 420 (FIG. 4).

Figure 4:
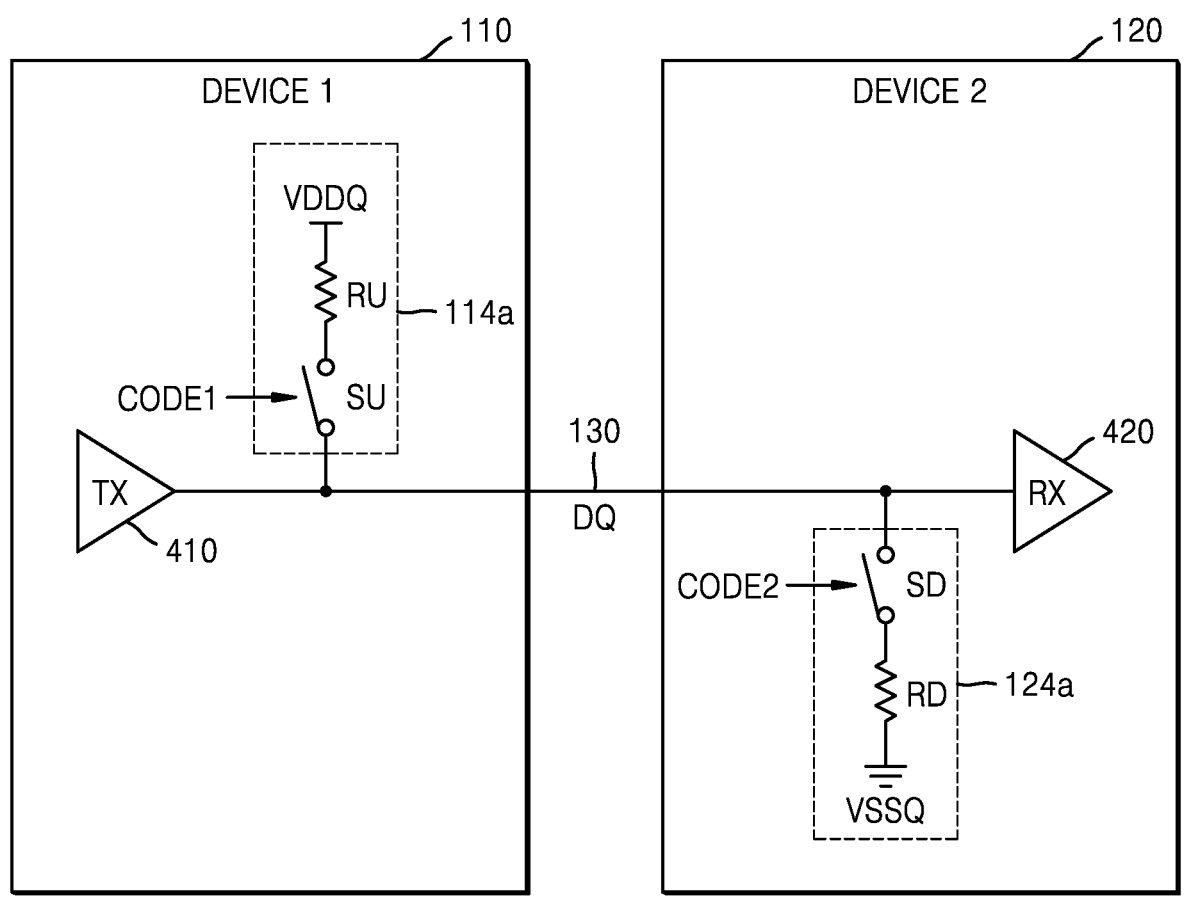
FIG. 4 is a diagram illustrating an input high level (VIH) parameter of a memory device according to some embodiments.

FIG. 4 is a diagram illustrating a VIH parameter of a memory device according to some embodiments. In FIG. 4, the VIH of DQ data received by the memory device 120 is described. For convenience of explanation, the DQ line of the channel 130 is referred to as the DQ line 130. Hereinafter, suffixes (e.g., a of 114a and b of 114b) attached to reference numerals are for distinguishing a plurality of circuits having the same function.

Referring to FIGS. 1 to 4, to satisfy the VIH specification between the memory controller 110 and the memory device 120, each of the RCW 111 and the MRS 121 may store a parameter for controlling the impedance of the output driver circuit 300 of the memory controller 110 and the memory device 120. Each of the RCW 111 and MRS 121 may include an operation code OP[2:0] illustrating output driver impedance control. When bits of the operation code OP[2:0] are set to a value of "000", the output driver impedance is disabled (default). When bits of the operation code OP[2:0] are set as a value of "001", the output driver impedance is preselected to RZQ/1. RZQ may be set as, for example, 240Ω. When bits of the operation code OP[2:0] are set as a value of "010" value, the output driver impedance is preselected to RZQ/2, when bits of the operation code OP[2:0] are set as a value of "011", the output driver impedance is preselected as RZQ/3, when bits of the operation code OP[2:0] are set as a value of "100", the output driver impedance is preselected as RZQ/4, when bits of the operation code OP[2:0] are set to a value of "101", the output driver impedance is preselected as RZQ/5, when bits of the operation code OP[2:0] are set to a value of "110", the output driver impedance is preselected as RZQ/6, and a value of "111" may be preselected as reserved future usage (RFU). For convenience of description, the output driver impedance may be used interchangeably with an ODT resistance value.

Meanwhile, a high-speed I/O interface between the memory controller 110 and the memory device 120 may use a signal having an amplitude or a swing range of about 0.5 of the power supply voltage VDDQ. A signal transmitted from the memory controller 110 to the memory device 120 may be designed to have the VIH of about 0.5*VDDQ. For example, the power supply voltage VDDQ may be in a range of about 0.3 V to about 0.5 V, and the input high level VIH may be calibrated as about 250 mV. To satisfy such a signaling method, the SoC ODT code of the RCW 111 may also be set in the same manner as the MRS 121. The ODT resistance value of each of the memory controller 110 and the memory device 120 may be preset to 240Ω by the SoC ODT code "000".

The transmitter 410 of the memory controller 110 and the receiver 420 of the memory device 120 may be connected to each other through the DQ line 130. The memory controller 110 may include an ODT circuit 114a connected to the DQ line 130, and the ODT circuit 114a may be configured as a pull-up circuit connected to the power supply voltage VDDQ line. The ODT circuit 114a may include a pull-up switch SU disposed to correspond to the pull-up resistor RU connected between the power supply voltage VDDQ line and the DQ line 130. The pull-up resistor RU and the pull-up switch SU conceptually represent the PMOS transistors PTR (FIG. 3) turned on or off in response to the first code signal CODE1. When the pull-up switch SU is turned on by the first code signal CODE1, the ODT circuit 114a may be ODT enabled, and when the pull-up switch SU is turned off, the ODT circuit 114a may be ODT disabled.

The memory device 120 may include an ODT circuit 124a connected to the DQ line 130, and the ODT circuit 124a may be configured as a pull-down circuit connected to a ground voltage VSSQ line. The ODT circuit 124a may include a pull-down resistor RD connected between the DQ line 130 and the ground voltage VSSQ line and a pull-down switch SD disposed to correspond to the pull-down resistor RD. The pull-down resistor RD and the pull-down switch SD conceptually represent the NMOS transistors NTR (FIG. 3) turned on or off in response to the second code signal CODE2. When the pull-down switch SD is turned on by the second code signal CODE2, the ODT circuit 124a may be ODT enabled, and when the pull-down switch SD is turned off, the ODT circuit 124a may be ODT disabled.

During a write operation of the memory device 120, the transmitter 410 of the memory controller 110 may transmit the logic high level data DQ of about 0.5*VDDQ to the memory device 120 through the DQ line 130. At this time, the ODT circuit 114*a* of the memory controller 110 may be ODT disabled. In the memory device 120, the ODT circuit 124*a* may be terminated with the same ODT resistance value as the output driver impedance of the memory controller 110 so that the receiver 420 receives the data DQ of the VIH of about 0.5*VDDQ transmitted through the DQ line 130. Because the output driver impedance of the memory controller 110 and the ODT resistance value of the receiver of the memory device 120 are the same, the VIH specification of the DQ pin may be satisfied.

However, the memory device 120 includes a plurality of DQ pins, and the DQ pins may have different VIH parameters (e.g., values for the VIH parameter) according to their respective environments (e.g., circuit device characteristics and arrangement). Moreover, the VIH parameter distribution may be attributed to the characteristic distribution of the transmitter 410 of the memory controller 110, the DQ line 130 and/or the ODT circuit 124*a* of the memory device 120. Performance of the memory device 120 may be degraded due to a bad VIH parameter in the VIH parameter distribution (e.g., distribution in values for the VIH parameter). A system based on the memory device 120 may experience a failure. Hereinafter, to reduce the VIH parameter distribution of a plurality of DQ pins, per-pin calibration operations using the per-pin calibration circuit 126 of FIG. 1 are described in detail through various embodiments.

Figure 5:
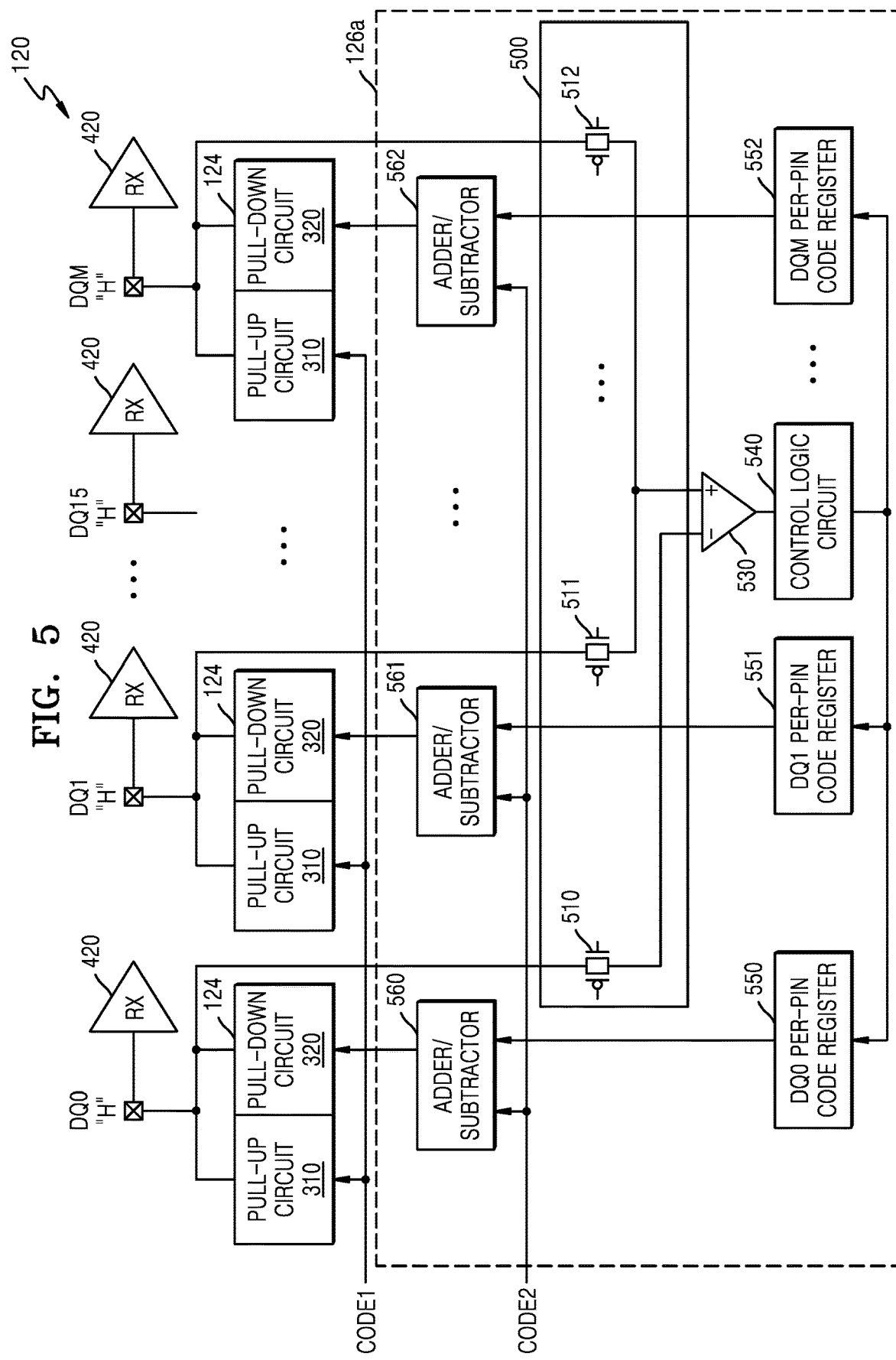
FIG. 5 is a diagram illustrating a per-pin calibration circuit according to some embodiments.

FIG. 5 is a diagram illustrating a per-pin calibration circuit according to some embodiments.

Referring to FIGS. 1 to 5, the memory device 120 may include a plurality of DQ pins DQ0, DQ1, DQ15, and DQM related to the data DQ. A logic high level "H" may be applied to the plurality of DQ pins DQ0, DQ1, DQ15, and DQM by the memory controller 110. A signal indicating masking of part of the received data DQ may be received by the DQM pin. Each of the plurality of DQ pins DQ0, DQ1, DQ15, and DQM may have an ODT resistance value set by the pull-down circuit 320 of the ODT circuit 124. Accordingly, each of the plurality of DQ pins DQ0, DQ1, DQ15, and DQM may have a VIH parameter.

The plurality of DQ pins DQ0, DQ1, DQ15, and DQM may be connected to a per-pin calibration circuit 126*a*. The per-pin calibration circuit 126*a* may perform a per-pin calibration operation of selecting the DQ0 pin from among the plurality of DQ pins DQ0, DQ1, DQ15, and DQM, and comparing the VIH value of the DQ0 pin to the VIH of each of the other DQ pins DQ1, DQ15, and DQM, so that the VIH value of each of the other DQ pins DQ1, DQ15, and DQM is the same as the VIH value of the DQ0 pin.

The per-pin calibration circuit 126*a* may include a multiplexer circuit 500, a comparator circuit 530, a control logic circuit 540, per-pin code registers 550 to 552, and adders/subtractors 560 to 562. The multiplexer circuit 500 may include a transmission gate circuit 510 transmitting the VIH of the DQ0 pin as a first input of the comparator circuit 530, and transmission gate circuits 511 and 512 sequentially transmitting the VIH of each of the other DQ pins DQ1, DQ15, and DQM as a second input of the comparator circuit 530. The comparator circuit 530 may sequentially compare the VIH value of the DQ0 pin with the VIH value of each of the other DQ pins DQ1, DQ15, and DQM. The control logic circuit 540 may generate a per-pin ODT code signal corresponding to each of the DQ pins DQ0, DQ1, DQ15, and DQM based on the output value of the comparator circuit 530.

For example, when the VIH value of the DQ0 pin, which is the first input of the comparator circuit 530, is higher than the VIH value of the DQ1 pin, which is the second input of the comparator circuit 530, a per-pin ODT code signal of the DQ0 pin may be increased by +1 from its default value (e.g. zero) to reduce the VIH value of the DQ0 pin or a per-pin ODT code signal of the DQ1 pin may be reduced by −1 from its default value so as to increase the VIH value of the DQ1 pin. When the VIH value of the DQ0 pin, which is the first input of the comparator circuit 530, is lower than the VIH value of the DQ1 pin, which is the second input of the comparator circuit 530, the per-pin ODT code signal of the DQ1 pin may be increased by +1 from its default value to reduce the VIH value of the DQ1 pin.

The per-pin ODT code signal of the DQ0 pin may be stored in the DQ0 per-pin code register 550, and the per-pin ODT code signal of the DQ1 pin may be stored in the DQ1 per-pin code register 551. The per-pin ODT code signal of the DQ0 pin stored in the DQ0 per-pin code register 550 may be provided to the adder/subtractor 560, and the per-pin ODT code signal of the DQ1 pin stored in the DQ1 per-pin code register 551 may be provided to the adder/subtractor 561.

The adder/subtractor 560 may perform an operation of adding or subtracting the per-pin ODT code signal of the DQ0 pin with respect to the second code signal CODE2 provided to the pull-down circuit 320 of the ODT circuit 124 of the DQ0 pin. A calculation result code of the adder/subtractor 560 may be provided to the pull-down circuit 320 of the ODT circuit 124, and the ODT resistance value of the DQ0 pin is changed so that the VIH value of the DQ0 pin may be changed. Similarly, the adder/subtractor 561 may perform an operation of adding or subtracting the per-pin ODT code signal of the DQ1 pin with respect to the second code signal CODE2 provided to the pull-down circuit 320 of the ODT circuit 124 of the DQ1 pin. A calculation result code of the adder/subtractor 561 may be provided to the pull-down circuit 320 of the ODT circuit 124 so that the ODT resistance value of the DQ1 pin may be changed.

The control logic circuit 540 may perform a comparison operation until the VIH value of each of the other DQ pins DQ1, DQ15, and DQM is almost the same as the VIH of the DQ0 pin to enter a dither condition in which the per-pin ODT code signal oscillates. When a result of comparison between the VIH value of the DQ0 pin and the VIH value of each of the other DQ pins DQ1, DQ15, and DQM indicates the dither condition, the control logic circuit 540 may provide the per-pin ODT code signal stored in each of the per-pin code registers 550 to 552 to the MRS 121 as shown in FIG. 7.

Figure 6A:
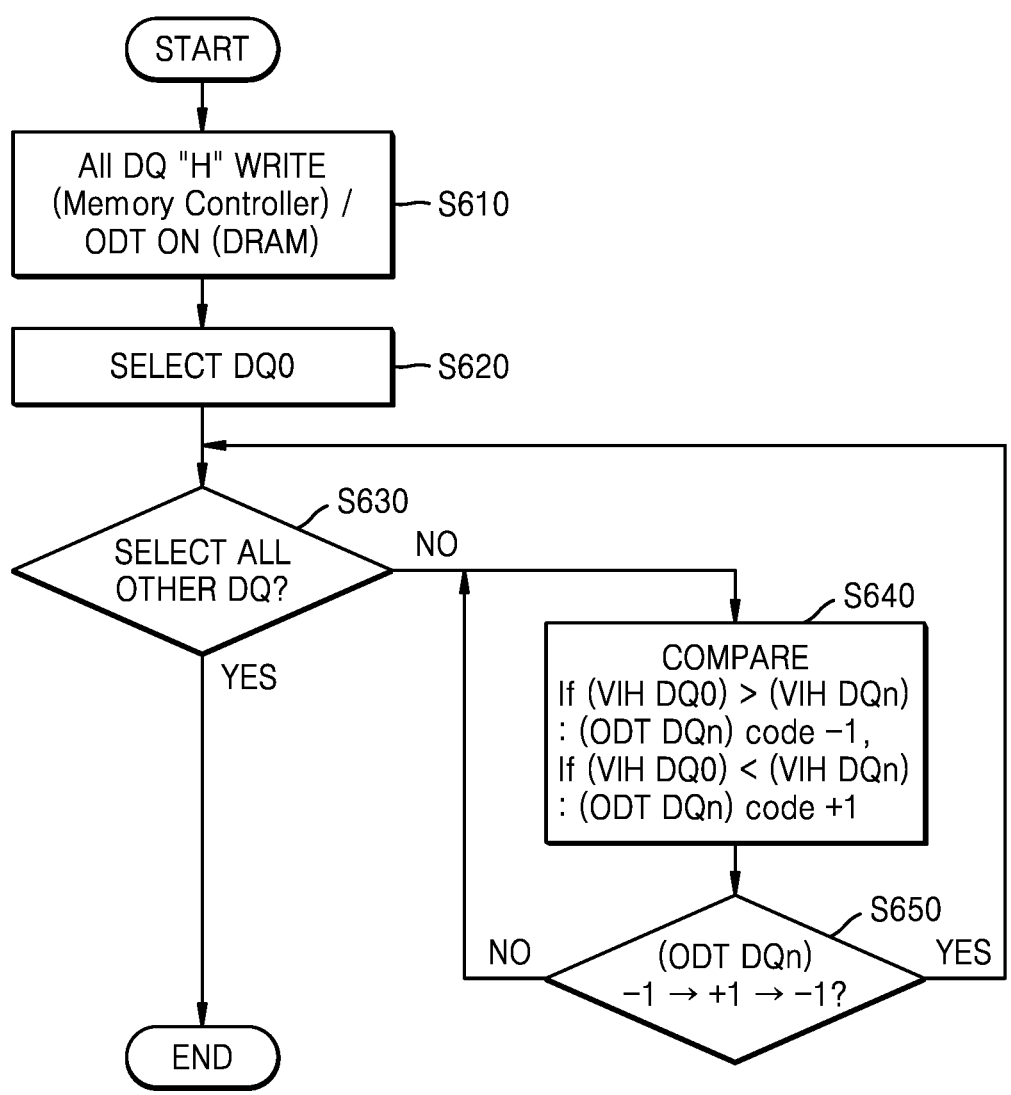
FIGS. 6A to 6C and 7 are diagrams illustrating a per-pin calibration operation according to some embodiments.
Figure 6B:
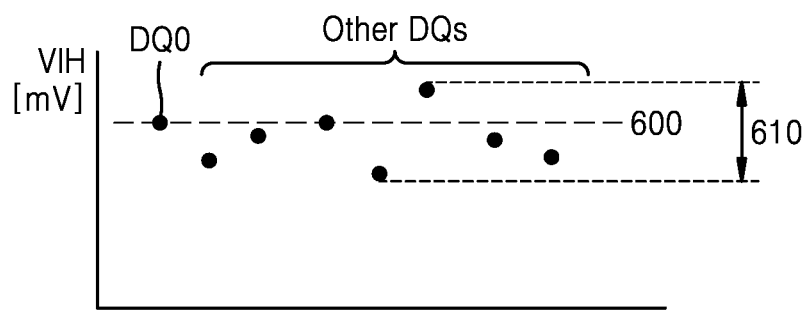
Figure 6C:
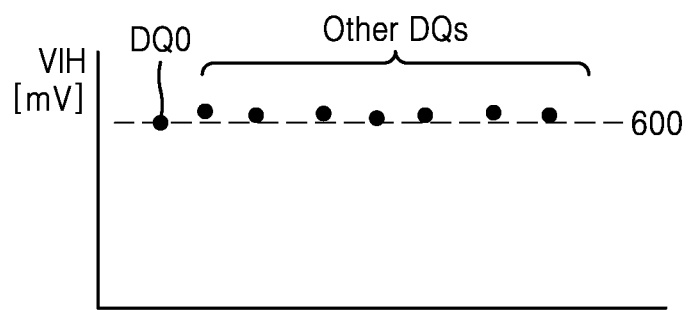
Figure 7:
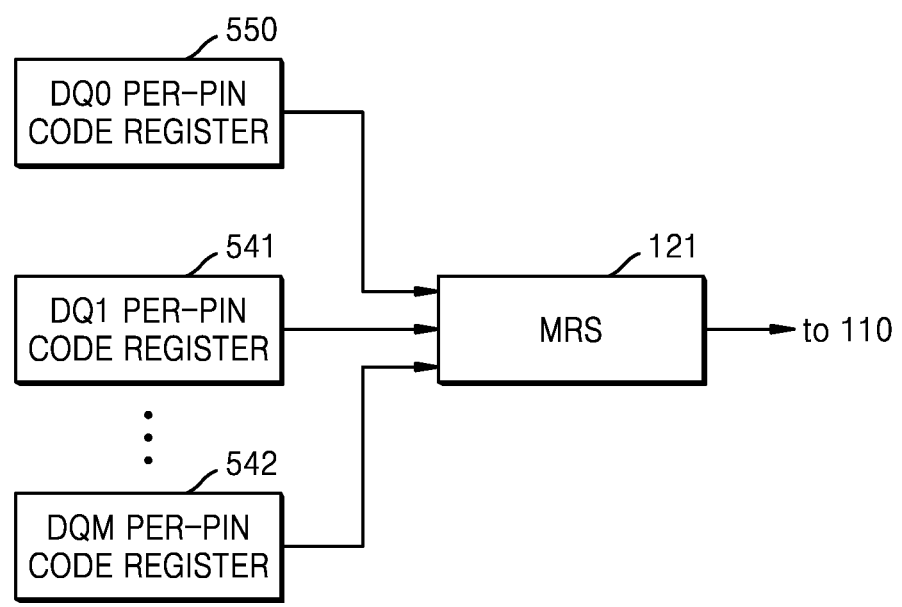

FIGS. 6A to 6C and 7 are diagrams illustrating a per-pin calibration operation according to some embodiments. FIG. 6A is a flowchart illustrating a per-pin calibration operation of FIG. 5. FIGS. 6B and 6C are diagrams showing VIH value distributions according to the per-pin calibration operation of FIG. 6A. FIG. 7 is a diagram illustrating an operation of providing a per-pin ODT code signal to the memory controller 110.

Referring to FIGS. 1 to 6A, a logic high level may be provided to all of the DQ pins DQ0, DQ1, DQ15, and DQM by the memory controller 110 (S610). In addition, the ODT resistance value of each of the plurality of DQ pins DQ0, DQ1, DQ15, and DQM of the memory device 120 may be set by the pull-down circuit 320 of the ODT circuit 124 (S610). Accordingly, the plurality of DQ pins DQ0, DQ1, DQ15, and DQM may have their VIH parameters set to values as shown in FIG. 6B, and a VIH 600 of the DQ0 pin and a VIH distribution 610 of the other DQ pins DQ1, DQ15, and DQM may be shown.

The per-pin calibration circuit 126a may select the DQ0 pin from among the plurality of DQ pins DQ0, DQ1, DQ15, and DQM (S620). The per-pin calibration circuit 126a may sequentially select the other DQ pins DQ1, DQ15, and DQM (S630), and sequentially compare the VIH value of the DQ0 pin to the VIH value of each of the other DQ pins DQ1, DQ15, and DQM (S640). In the comparison operation S640, when the VIH value of the DQ0 pin is higher than the VIH value of one (e.g., a DQn pin) of the other DQ pins DQ1, DQ15, and DQM, the per-pin calibration circuit 126a may reduce the per-pin ODT code signal of the DQn pin by −1 from its default value so as to increase the VIH value of the DQn pin. Accordingly, the ODT resistance value of the DQn pin may be increased. The per-pin calibration circuit 126a may increase the per-pin ODT code signal of the DQn pin by +1 from its default value so as to reduce the VIH value of the DQn pin when the VIH of the DQ0 pin is lower than the VIH value of the DQn pin. Accordingly, the ODT resistance value of the DQn pin may be reduced. The comparison operation S640 of the per-pin calibration circuit 126a may be performed until a dither condition in which a result of comparison oscillates to −1, +1, and −1 occurs (S650). Accordingly, as shown in FIG. 6C, it may be seen that the VIH value of the DQn pin may be calibrated to be almost the same as the VIH value 600 of the DQ0 pin, and there is almost no VIH value distribution of the DQ pins DQ0, DQ1, DQ15, and DQM.

Referring to FIG. 7, the per-pin calibration circuit 126a may store the per-pin ODT code signal stored in each of the pin code registers 550 to 552 corresponding to the DQ pins in the MRS 121 when the VIH value of the DQ0 pin and the VIH value of each of the other DQ pins DQ1, DQ15, and DQM are almost the same and reach the dither condition. The per-pin ODT code stored in the MRS 121 may be provided to the memory controller 110 by a mode register read command.

Figure 8:
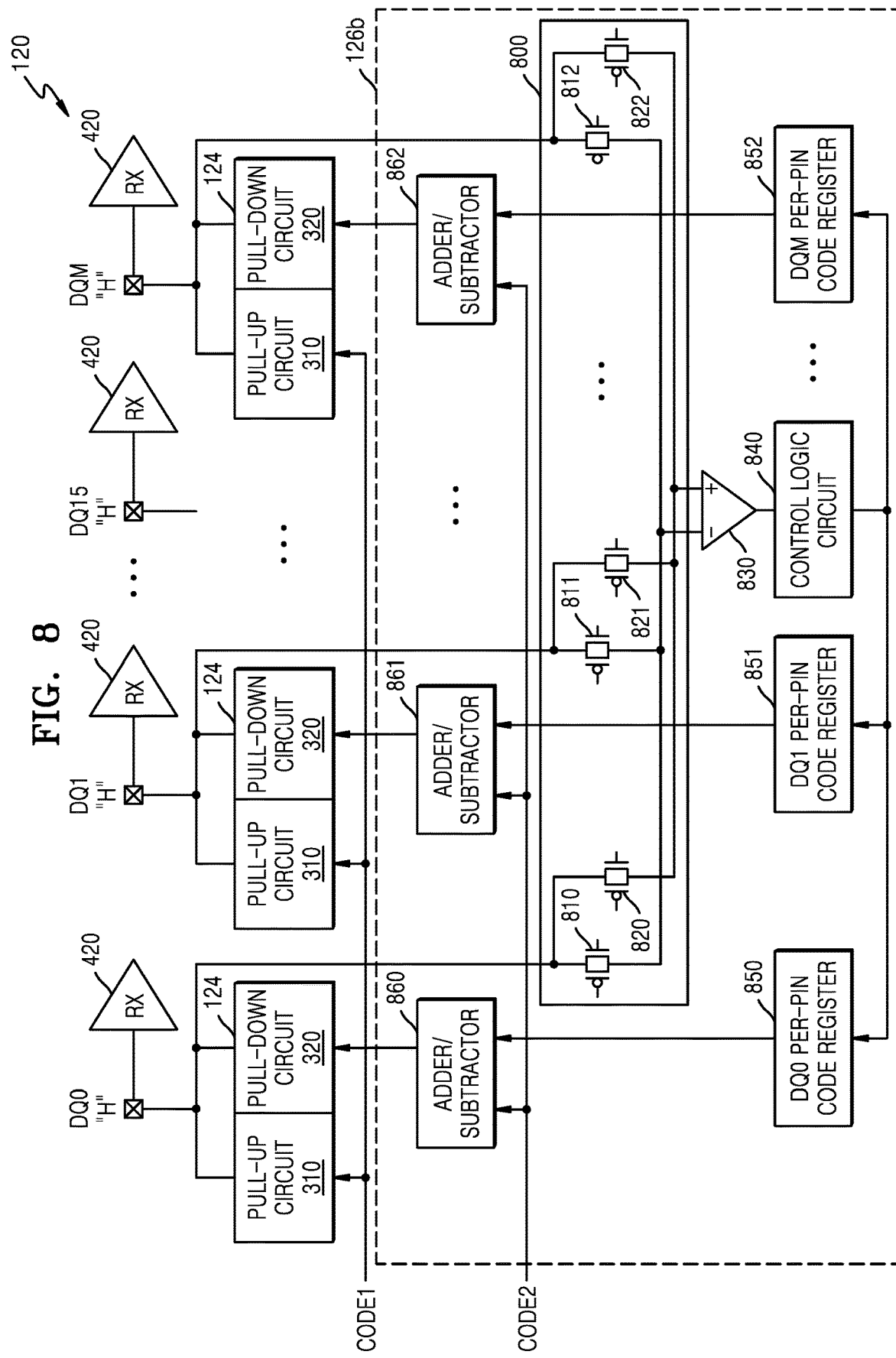
FIGS. 8 and 9A to 9D are diagrams illustrating a per-pin calibration circuit according to some embodiments.
Figure 9A:
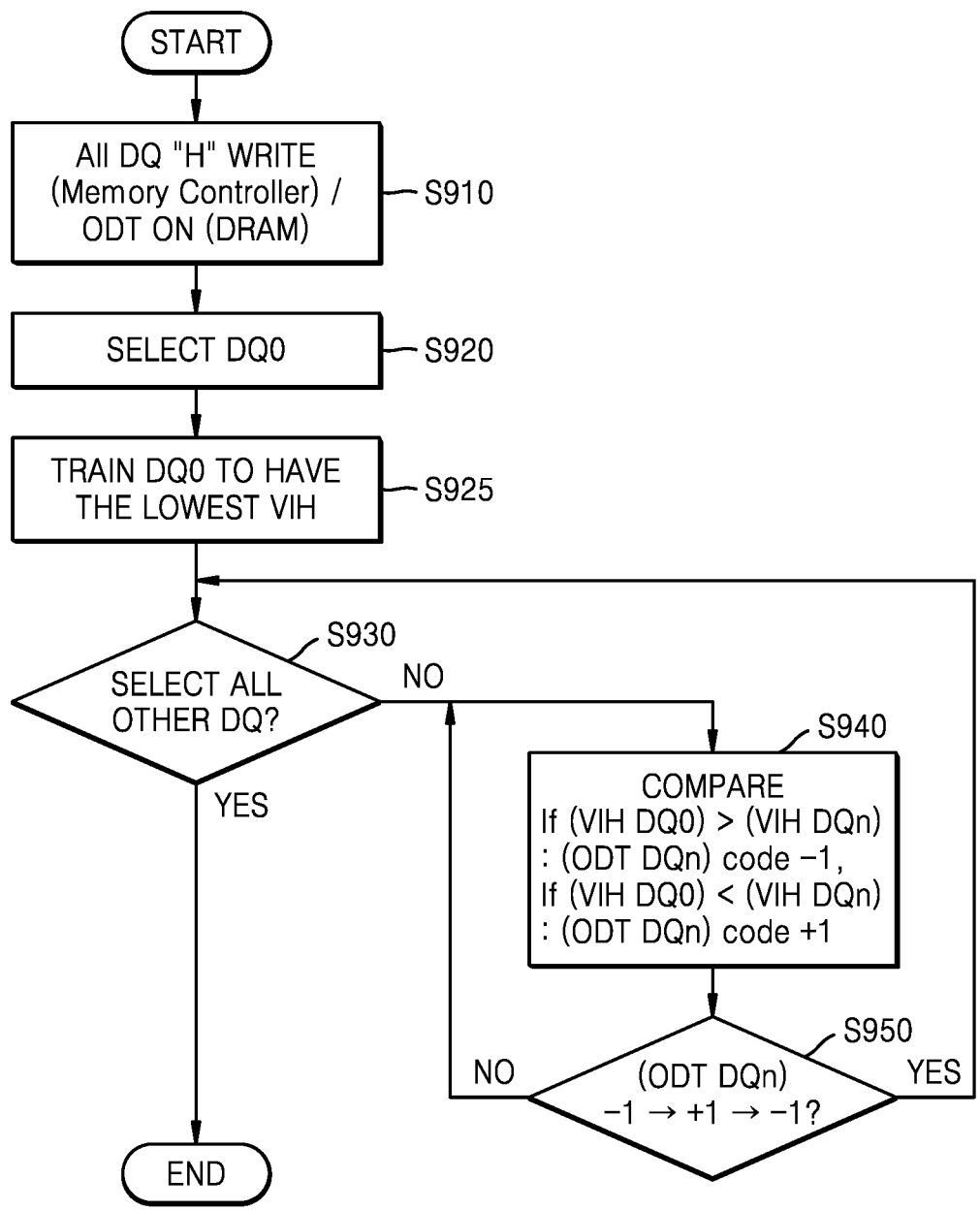

FIGS. 8 and 9A to 9D are diagrams illustrating a per-pin calibration circuit according to some embodiments. FIG. 8 is a circuit diagram illustrating the per-pin calibration circuit 126 of FIG. 1. FIG. 9A is a flowchart illustrating a per-pin calibration operation of FIG. 8, and FIGS. 9B to 9D are diagrams illustrating VIH distributions according to the per-pin calibration operation of FIG. 9A.

Referring to FIGS. 1 to 4 and 8, a per-pin calibration circuit 126b is different from the per-pin calibration circuit 126a of FIG. 5 in that the configuration of a multiplexer circuit 800 is different. Hereinafter, a redundant description of the per-pin calibration circuit 126 is omitted.

The per-pin calibration circuit 126b may include the multiplexer circuit 800, a comparator circuit 830, a control logic circuit 840, per-pin code registers 850 to 852, and adders/subtractors 860 to 862. The multiplexer circuit 800 may include transmission gate circuits 810, 811, and 812 transmitting the VIH of one of the DQ pins DQ0, DQ1, DQ15, and DQ as a first input of the comparator circuit 830 and transmission gate circuits 820, 821, and 822 transmitting the VIH of the other one of the DQ pins DQ0, DQ1, DQ15, and DQ as a second input of the comparator circuit 830. The comparator circuit 830 may compare the VIH value of the first input with the VIH value of the second input.

The control logic circuit 840 may select a DQ pin (e.g., the DQ0 pin) having the lowest VIH value from among the DQ pins DQ0, DQ1, DQ15, and DQ based on the output value of the comparator circuit 830. The control logic circuit 840 may perform a comparison operation until the VIH value of the DQ0 pin having the lowest VIH value and the VIH value of each of the other DQ pins DQ1, DQ15, and DQM are almost the same to enter a dither condition in which the per-pin ODT code signal oscillates. When a result of comparison between the VIH value of the DQ0 pin and the VIH value of each of the other DQ pins DQ1, DQ15, and DQM indicates the dither condition, the control logic circuit 840 may store the per-pin ODT code signal in each of the per-pin code registers 850 to 852. The per-pin ODT code signals stored in each of the per-pin code registers 850 to 852 may be stored in the MRS 121 and provided to the memory controller 110 (FIG. 7).

The adders/subtractors 860, 861, and 862 perform an operation of adding or subtracting the per-pin ODT code signal of the DQ0 pin with respect to the second code signal CODE2 provided to the pull-down circuit 320 of the ODT circuit 124 of the DQ0 pin. The calculation result codes of the adders/subtractors 860, 861, and 862 may be provided to the pull-down circuit 320 of the ODT circuit 124, and the ODT resistance value of the DQ0 pin is changed so that the VIH of the DQ0 pin may be changed. Accordingly, each of the DQ pins DQ0, DQ1, DQ15, and DQM may be calibrated to have the lowest VIH value.

Figure 9B:
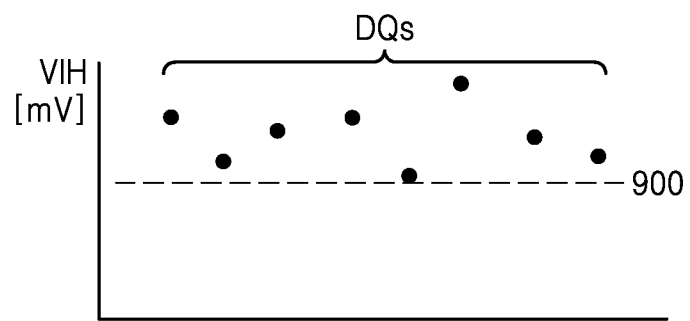
Figure 9C:
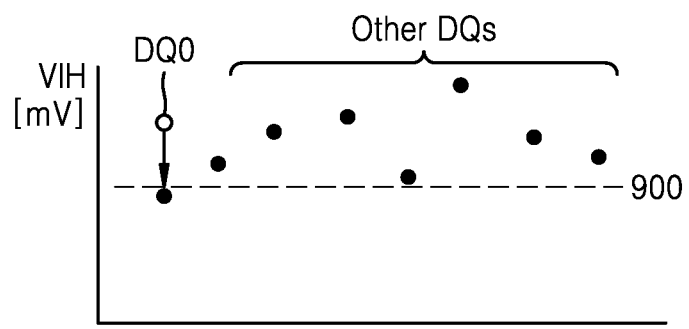

Referring to FIGS. 8 and 9A, a logic high level may be provided to all of the DQ pins DQ0, DQ1, DQ15, and DQM by the memory controller 110 (S910). In addition, the ODT resistance value of each of the plurality of DQ pins DQ0, DQ1, DQ15, and DQM of the memory device 120 may be set by the pull-down circuit 320 of the ODT circuit 124 (S910). Accordingly, the plurality of DQ pins DQ0, DQ1, DQ15, and DQM may have their VIH parameter values as shown in FIG. 9B, and a lowest VIH value 900 may be shown.

Figure 9D:
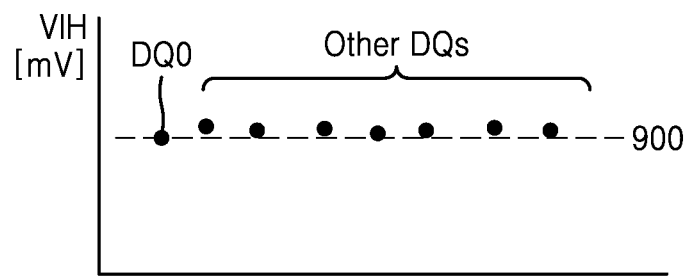

The per-pin calibration circuit 126b may select the DQ0 pin from among the plurality of DQ pins DQ0, DQ1, DQ15, and DQM (S920), and train the DQ0 pin to have the lowest VIH value (S925). Accordingly, as shown in FIG. 9B, the DQ0 pin may have the lowest VIH value 900. Thereafter, the per-pin calibration circuit 126b may sequentially select the other DQ pins DQ1, DQ15, and DQM (S930), and sequentially compare the lowest VIH value of the DQ0 pin to the VIH value of each of the other DQ pins DQ1, DQ15, and DQM (S940). The per-pin calibration circuit 126b may perform the comparison operation S940 until a dither condition in which a result of comparison oscillates to −1, +1, and −1 occurs (S950). Accordingly, as shown in FIG. 9D, it may be seen that the VIH value of the other DQ pins DQ1, DQ15, and DQM may be calibrated to be almost the same as the lowest VIH 900 of the DQ0 pin, and there is almost no VIH value distribution of the DQ pins DQ0, DQ1, DQ15, and DQM.

Figure 10A:
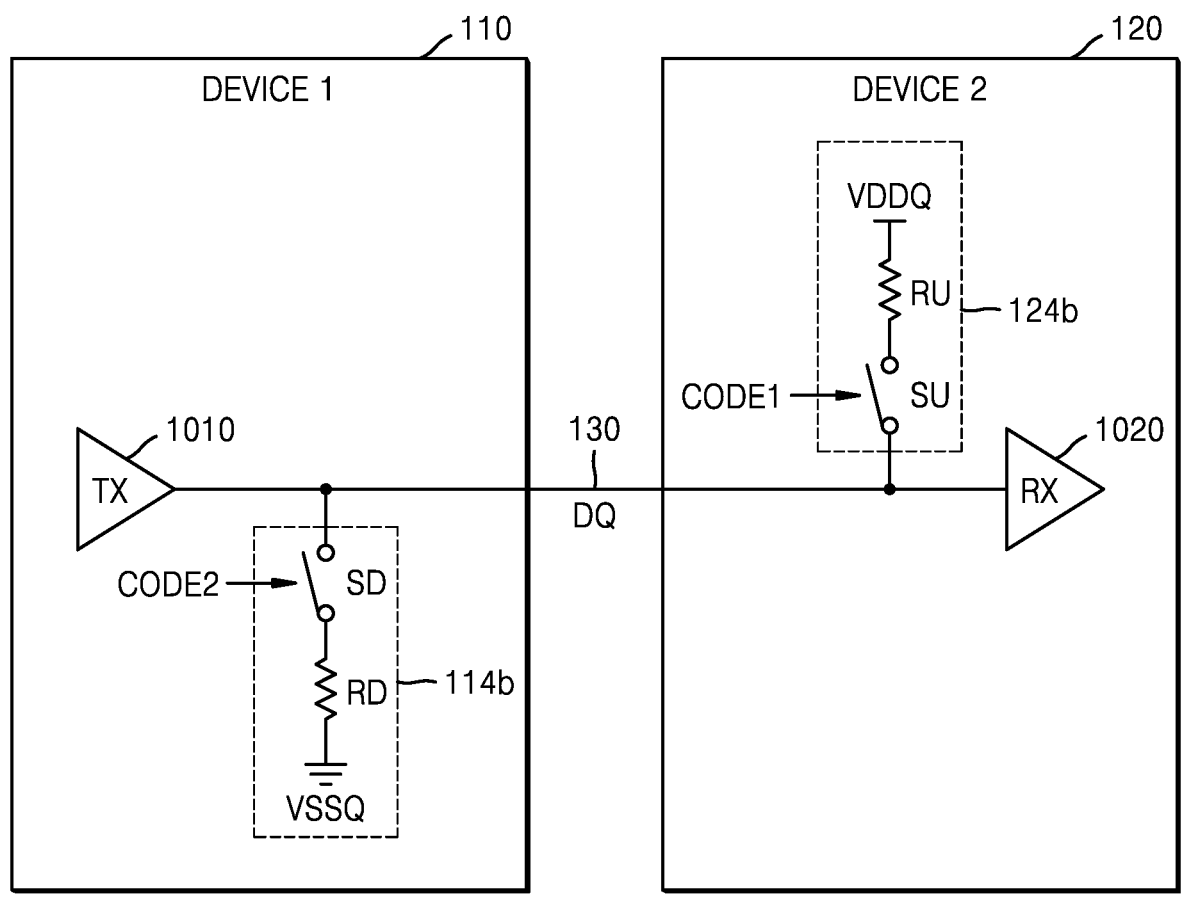
FIGS. 10A, 10B, 11, and 12 are diagrams illustrating input low level (VIL) parameters of a memory device according to some embodiments.
Figure 10B:
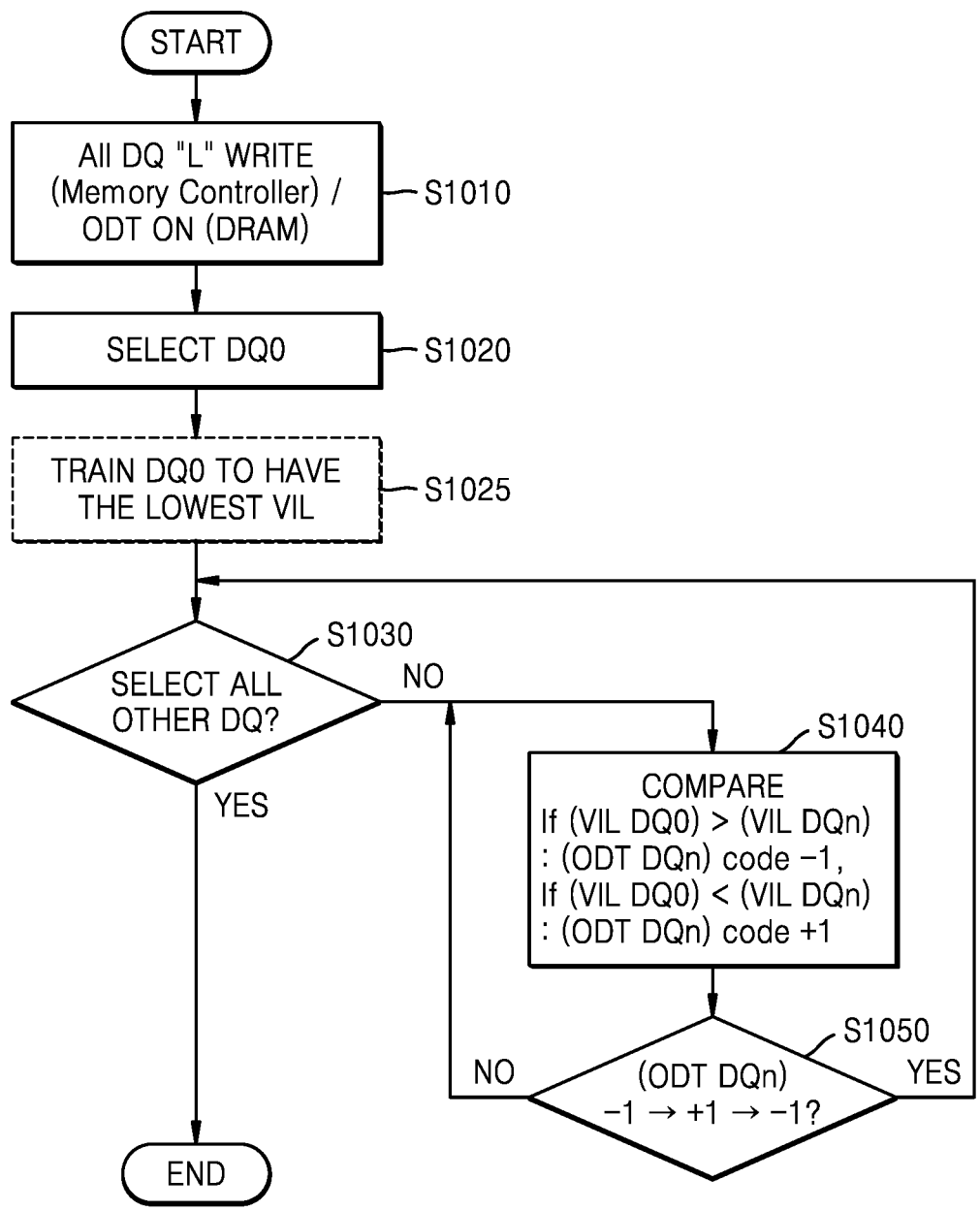
Figure 11:
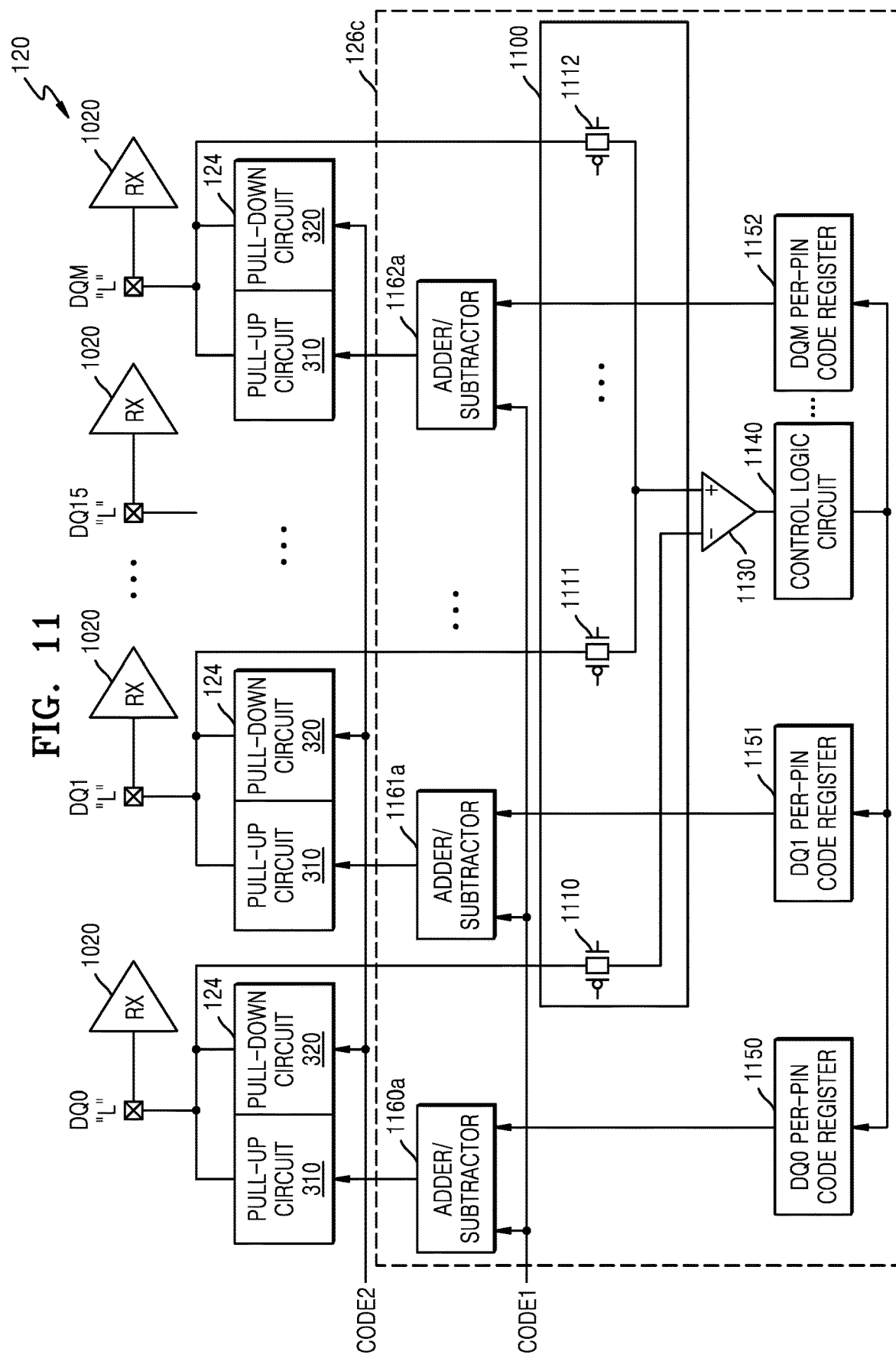
Figure 12:
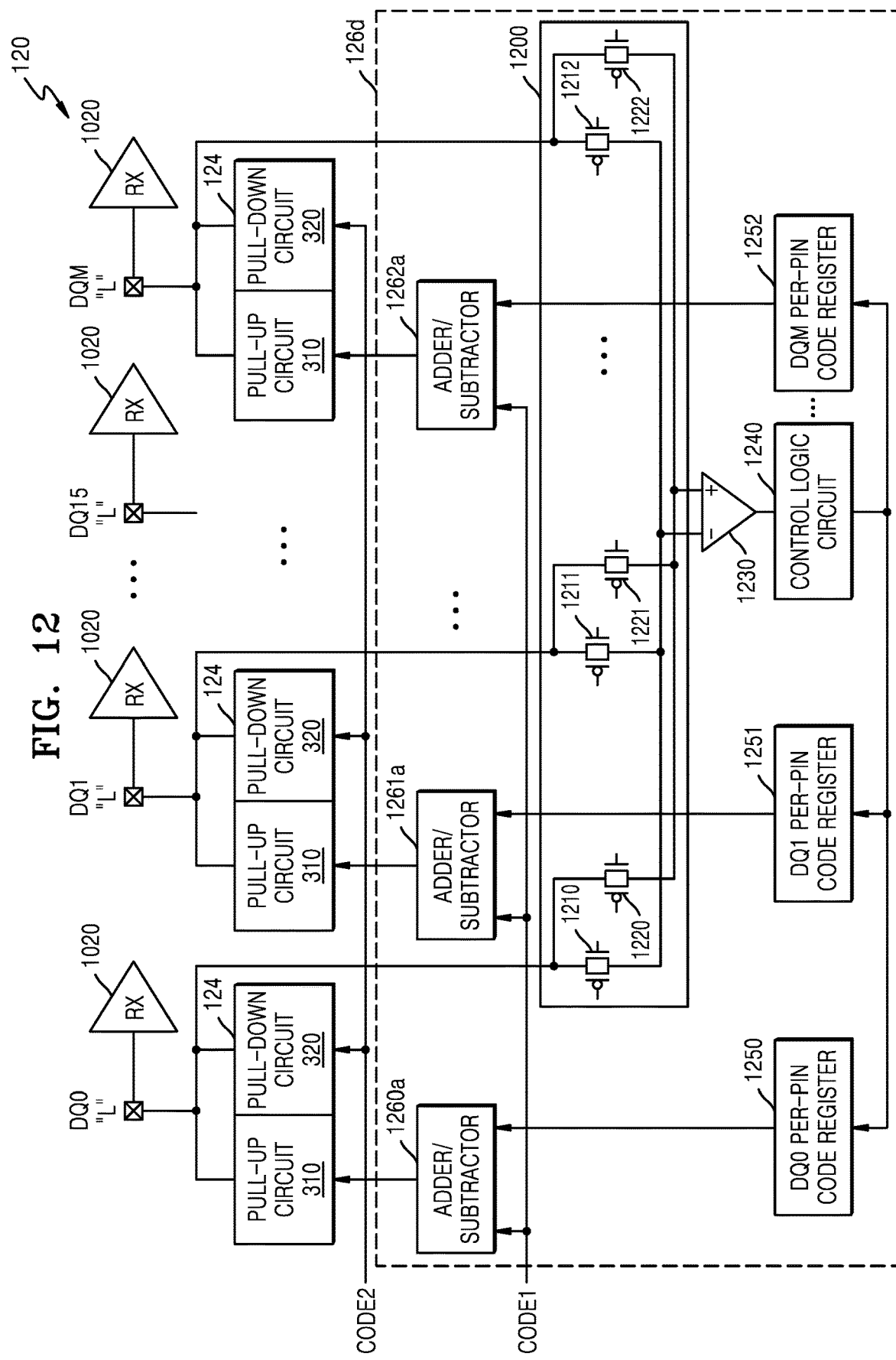

FIGS. 10A to 12 are diagrams illustrating input low level (VIL) parameters of a memory device according to some embodiments. FIG. 10A illustrates the concept of a VIL parameter of DQ data received by the memory device 120, and FIG. 10B is a flowchart illustrating a per-pin calibration operation on the VIL parameter of FIG. 10A. FIGS. 11 and 12 are diagrams illustrating per-pin calibration circuits 126c and 126d performing the per-pin calibration operation of FIG. 10B.

Referring to FIGS. 1 to 3 and 10A, to satisfy the VIL specification between the memory controller 110 and the memory device 120, each of the RCW 111 and the MRS 121 may store an output driver impedance parameter of the memory controller 110 and the memory device 120. A transmitter 1010 of the memory controller 110 and a receiver 1020 of the memory device 120 may be connected to each other through the DQ line 130. The memory controller 110 may include an ODT circuit 114b connected to the DQ line 130, and the ODT circuit 114b may be configured as a pull-down circuit connected to the ground voltage VSSQ line. The ODT circuit 114b may include a pull-down switch SD disposed to correspond to the pull-down resistor RD connected between the ground voltage VSSQ line and the DQ line 130. When the pull-down switch SD is turned on by the second code signal CODE2, the ODT circuit 114b may be ODT enabled, and when the pull-down switch SD is turned off, the ODT circuit 114b may be ODT disabled.

The memory device 120 may include an ODT circuit 124b connected to the DQ line 130, and the ODT circuit 124b may be configured as a pull-up circuit connected to the power supply voltage VDDQ line. The ODT circuit 124b may include a pull-up switch SU disposed to correspond to the pull-up resistor RU connected between the power supply voltage VDDQ line and the DQ line 130. When the pull-up switch SU is turned on by the first code signal CODE1, the ODT circuit 124b may be ODT enabled, and when the pull-up switch SU is turned off, the ODT circuit 124b may be ODT disabled.

During a write operation of the memory device 120, the transmitter 1010 of the memory controller 110 may transmit logic low level data DQ to the memory device 120 through the DQ line 130. At this time, the ODT circuit 114b of the memory controller 110 may be ODT disabled. In the memory device 120, the ODT circuit 124b may be terminated with the same ODT resistance value as the output driver impedance of the memory controller 110 so that the receiver 1020 receives the data DQ of the VIL transmitted through the DQ line 130. Because the output driver impedance of the memory controller 110 and the ODT resistance value of the receiver of the memory device 120 are the same, the VIL specification of the DQ pin may be satisfied.

However, the memory device 120 includes a plurality of DQ pins, and the DQ pins may have VIL parameter value distributions according to their respective environments (e.g., circuit device characteristics and arrangement) and characteristics of the transmitter 1010 of the memory controller 110, the DQ line 130, and/or the ODT circuit 124b of the memory device 120. To reduce the VIL parameter value distribution of the plurality of DQ pins, the per-pin calibration operation of FIG. 10B may be performed.

Referring to FIG. 10B, a logic low level may be provided to all of the DQ pins DQ0, DQ1, DQ15, and DQM by the memory controller 110 (S1010). Further, the ODT resistance value of each of the plurality of DQ pins DQ0, DQ1, DQ15, and DQM of the memory device 120 may be set by the pull-up circuit 310 of the ODT circuit 124 (S1010).

The per-pin calibration circuit 126c of FIG. 11 may select the DQ0 pin from among the plurality of DQ pins DQ0, DQ1, DQ15, and DQM (S1020). The per-pin calibration circuit 126c may sequentially select the other DQ pins DQ1, DQ15, and DQM (S1030), and sequentially compare the VIL value of the DQ0 pin with the VIL value of each of the other DQ pins DQ1, DQ15, and DQM (S1040). The per-pin calibration circuit 126c may perform the comparison operation S1040 until the VIL value of each of the other DQ pins DQ1, DQ15, and DQM is almost the same as the VIL of the DQ0 pin so that a dither condition in which a result of comparison oscillates to −1, +1, and −1 occurs (S1050). When the comparison operation $1040 reaches the dither condition, the per-pin calibration circuit 126c may store the per-pin ODT code signal of each of the DQ pins DQ0, DQ1, DQ15, and DQM in the MRS 121 and provide the per-pin ODT code signal to the memory controller 110.

The per-pin calibration circuit 126d of FIG. 12 may train the DQ0 pin to have the lowest VIL value (S1025). The per-pin calibration circuit 126d may sequentially select the other DQ pins DQ1, DQ15, and DQM (S1030), and sequentially compare the lowest VIL value of the DQ0 pin with the VIL of each of the other DQ pins DQ1, DQ15, and DQM (S1040). The per-pin calibration circuit 126d, may perform the comparison operation $1040 until the VIL of each of the other DQ pins DQ1, DQ15, and DQM is almost the same as the lowest VIL of the DQ0 pin so that the dither condition in which the result of comparison oscillates to −1, +1, and −1 occurs (S1050). When the comparison operation S1040 reaches the dither condition, the per-pin calibration circuit 126d may store the per-pin ODT code signal of each of the DQ pins DQ0, DQ1, DQ15, and DQM in the MRS 121 and provide the per-pin ODT code signal to the memory controller 110.

Figure 13A:
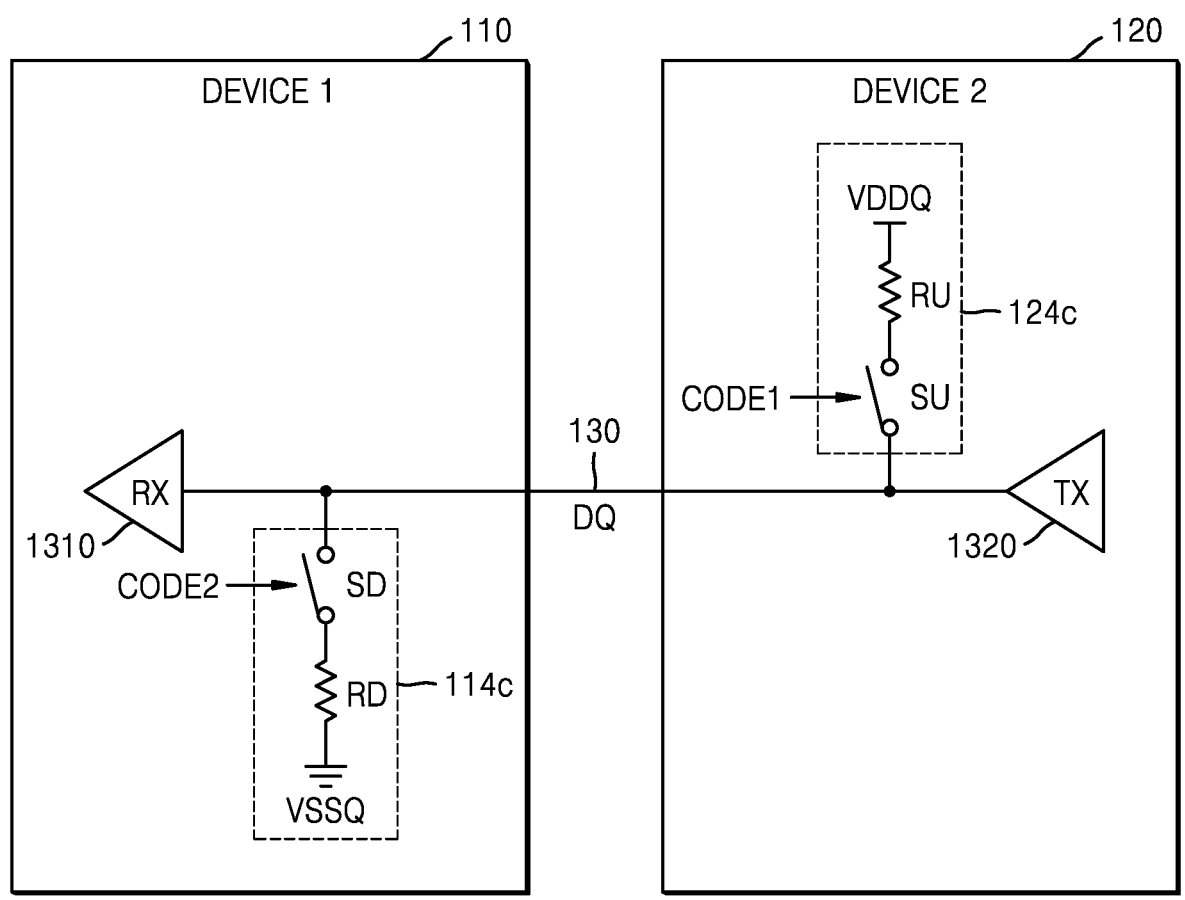
FIGS. 13A, 13B, 14, and 15 are diagrams illustrating output high level (VOH) parameters of a memory device according to some embodiments.
Figure 13B:
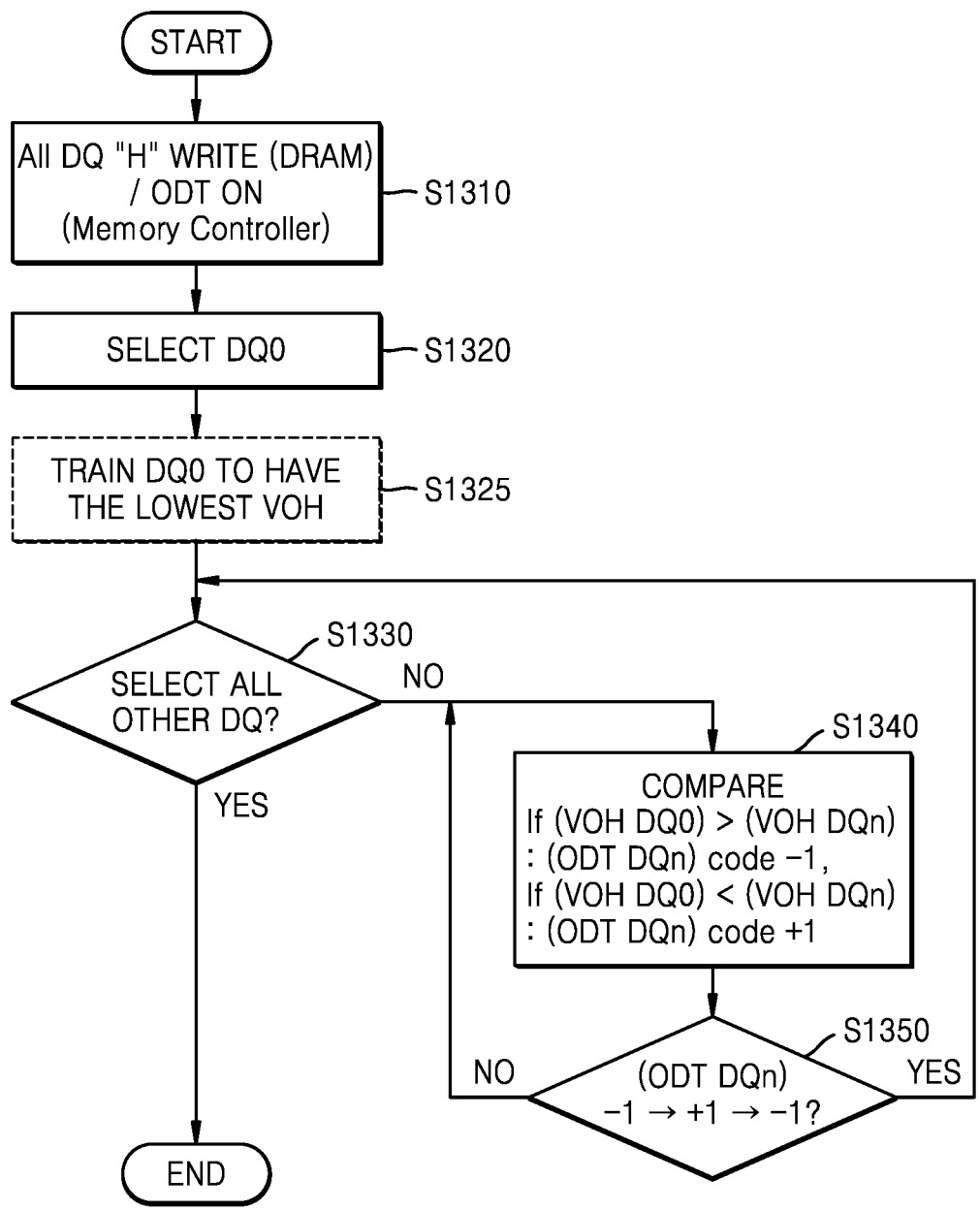
Figure 14:
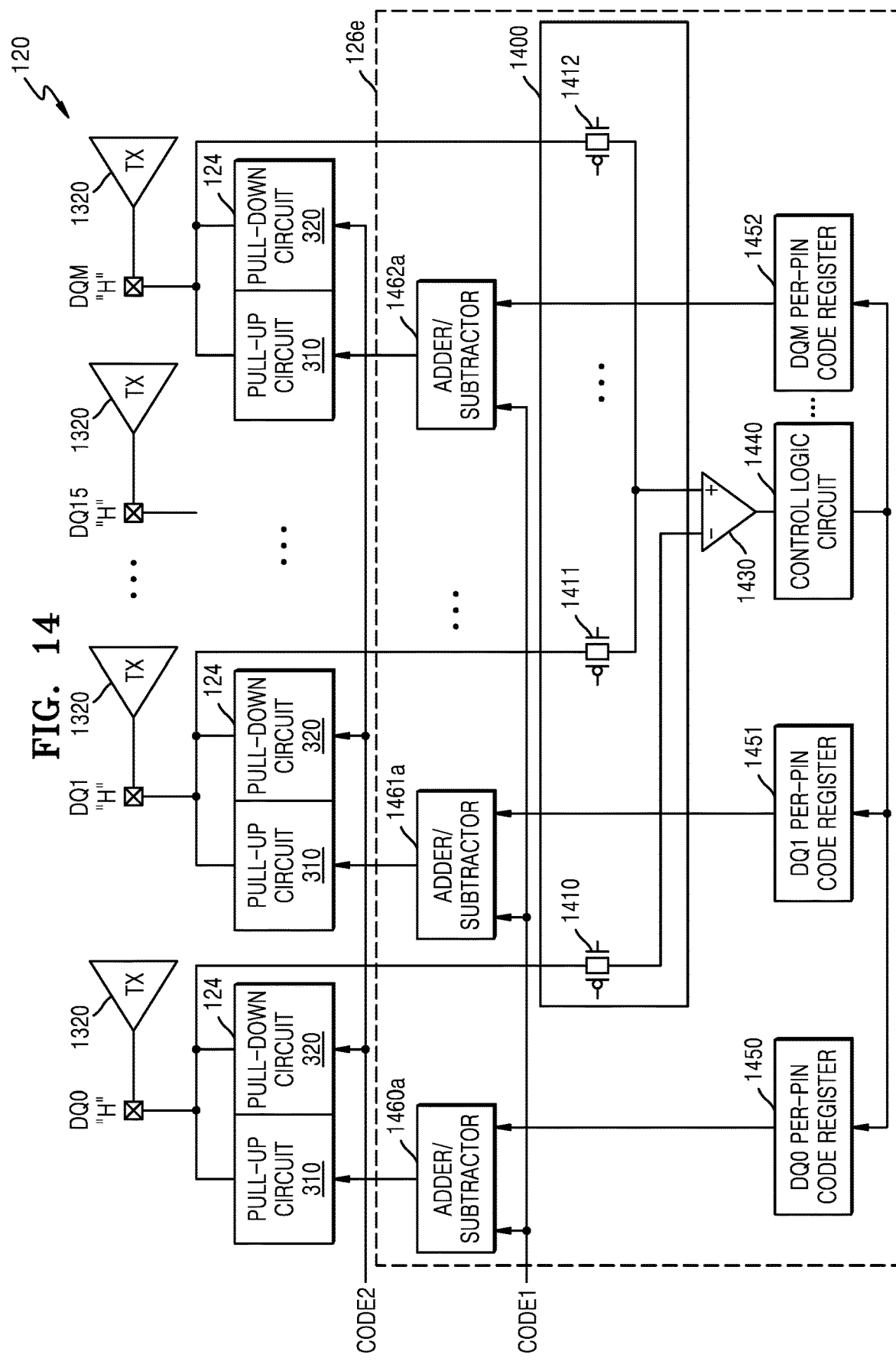
Figure 15:
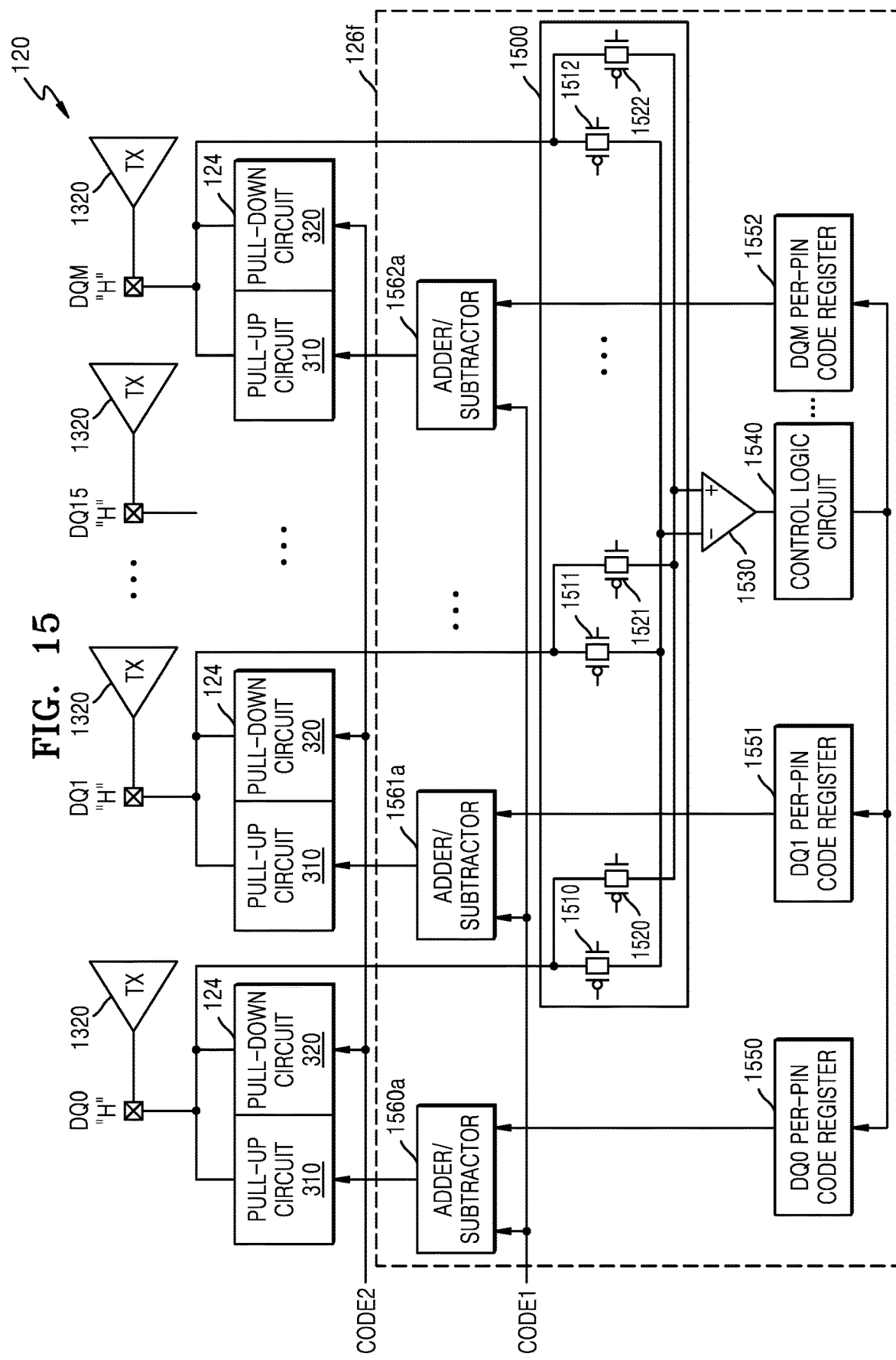

FIGS. 13A to 15 are diagrams illustrating output high level (VOH) parameters of a memory device according to some embodiments. FIG. 13A illustrates the concept of a VOH parameter of DQ data output by the memory device 120, and FIG. 13B is a flowchart illustrating a per-pin calibration operation on the VOH parameter of FIG. 13A. FIGS. 14 and 15 are diagrams illustrating per-pin calibration circuits 126e and 126f performing the per-pin calibration operation of FIG. 13B.

Referring to FIGS. 1 to 3 and 13A, to satisfy the VOH specification between the memory controller 110 and the memory device 120, each of the RCW 111 and the MRS 121 may store an output driver impedance parameter value of the memory controller 110 and the memory device 120. A transmitter 1320 of the memory device 120 and a receiver 1310 of the memory controller 110 may be connected to each other through the DQ line 130. The memory controller 110 may include an ODT circuit 114c connected to the DQ line 130, and the ODT circuit 114c may be configured as a pull-down circuit connected to the ground voltage VSSQ line. The ODT circuit 114c may include the pull-down switch SD disposed to correspond to the pull-down resistor RD connected between the ground voltage VSSQ line and the DQ line 130, and when the pull-down switch SD is turned on by the second code signal CODE2, the ODT circuit 114c may be ODT enabled.

The memory device 120 may include an ODT circuit 124c connected to the DQ line 130, and the ODT circuit 124c may be configured as a pull-up circuit connected to the power supply voltage VDDQ line. The ODT circuit 124c may include the pull-up switch SU disposed to correspond to the pull-up resistor RU connected between the power supply voltage VDDQ line and the DQ line 130. When the pull-up switch SU is turned off by the first code signal CODE1, the ODT circuit 124c may be ODT disabled.

During a read operation of the memory device 120, the transmitter 1320 of the memory device 120 may transmit the logic high level data DQ to the memory controller 110 through the DQ line 130. At this time, the ODT circuit 124c of the memory device 120 may be ODT disabled. In the memory controller 110, the ODT circuit 124c may be terminated with the same ODT resistance value as the output driver impedance of the memory device 120 so that the receiver 1310 receives the data DQ of the VOH transmitted through the DQ line 130. Because the output driver impedance of the memory device 120 and the ODT resistance value of the receiver of the memory controller 110 are the same, the VOH specification of the DQ pin may be satisfied.

However, the memory device 120 includes a plurality of DQ pins, and the DQ pins may have VOH parameter value distributions according to their respective environments (e.g., circuit device characteristics and arrangement) and characteristics of the transmitter 1320 of the memory device 120, the DQ line 130, and/or the ODT circuit 114c of the memory controller 110. To reduce the VOH parameter value distribution of the plurality of DQ pins, the per-pin calibration operation of FIG. 13B may be performed.

Referring to FIG. 13B, a logic high level may be provided to all of the DQ pins DQ0, DQ1, DQ15, and DQM by the memory device 12 (S1310). In addition, the ODT resistance value of each of the plurality of DQ pins DQ0, DQ1, DQ15, and DQM of the memory controller 110 may be set because the ODT circuit 114c is enabled (S1310).

The per-pin calibration circuit 126e of FIG. 14 may select the DQ0 pin from among the plurality of DQ pins DQ0, DQ1, DQ15, and DQM (S1320). The per-pin calibration circuit 126e may sequentially select the other DQ pins DQ1, DQ15, and DQM (S1330), and sequentially compare the VOH value of the DQ0 pin with the VOH value of each of the other DQ pins (S1340). The per-pin calibration circuit 126e may perform the comparison operation S1340 until the VOH value of each of the other DQ pins DQ1, DQ15, and DQM is almost the same as the VOH of the DQ0 pin.

In the comparison operation S1340, when the VOH value of the DQ0 pin is higher than the VOH value of one (e.g., the DQn pin) of the other DQ pins DQ1, DQ15, and DQM, the per-pin calibration circuit 126e may reduce the per-pin ODT code signal of the DQn pin by −1 from its default value so as to increase the VOH value of the DQn pin. Accordingly, the strength of the output driver of the DQn pin may be increased. The per-pin calibration circuit 126e may increase the per-pin ODT code signal of the DQn pin by +1 from its default value so as to reduce the VOH value of the DQn pin when the VOH value of the DQ0 pin is lower than the VOH value of the DQn pin. Accordingly, the strength of output driver of the DQn pin may be reduced. The comparison operation S1340 of the per-pin calibration circuit 126e may be performed until a dither condition in which a result of comparison oscillates to −1, +1, and −1 occurs (S1350). When the comparison operation S1340 reaches the dither condition, the per-pin calibration circuit 126e may store the per-pin ODT code signal of each of the DQ pins DQ0, DQ1, DQ15, and DQM in the MRS 121 and provide the per-pin ODT code signal to the memory controller 110.

The per-pin calibration circuit 126f of FIG. 15 may train the DQ0 pin to have the lowest VOH value (S1325). The per-pin calibration circuit 126f may sequentially select the other DQ pins DQ1, DQ15, and DQM (S1330), and sequentially compare the lowest VOH value of the DQ0 pin with the VOH value of each of the other DQ pins (S1340). The per-pin calibration circuit 126f may perform the comparison operation S1340 until the VOH value of each of the other DQ pins DQ1, DQ15, and DQM is almost the same as the lowest VOH value of the DQ0 pin so that a dither condition in which a result of comparison oscillates to −1, +1, and −1 occurs (S1350). When the comparison operation S1340 reaches the dither condition, the per-pin calibration circuit 126f may store the per-pin ODT code signal of each of the DQ pins DQ0, DQ1, DQ15, and DQM in the MRS 121 and provide the per-pin ODT code signal to the memory controller 110.

Figure 16A:
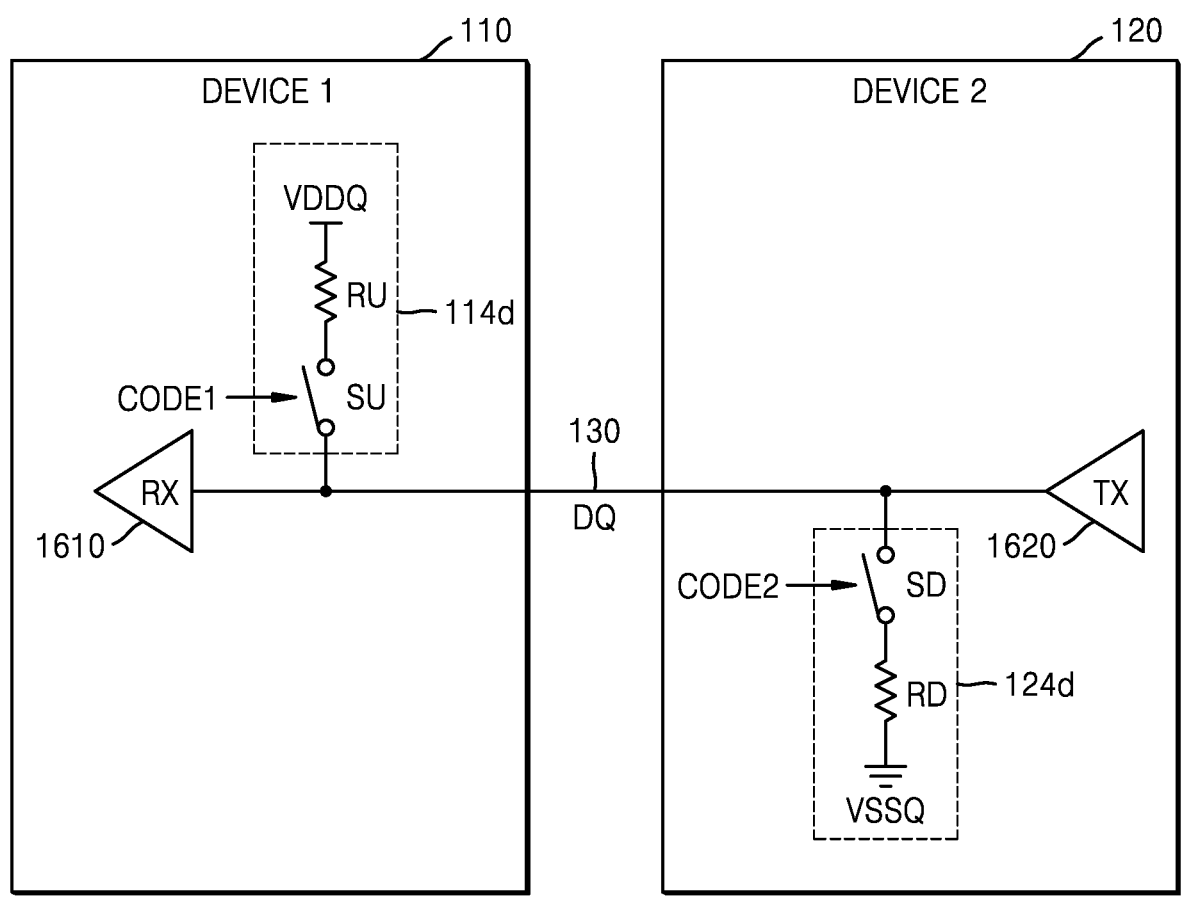
FIGS. 16A, 16B, 17, and 18 are diagrams illustrating output low level (VOL) parameters of a memory device according to some embodiments.
Figure 16B:
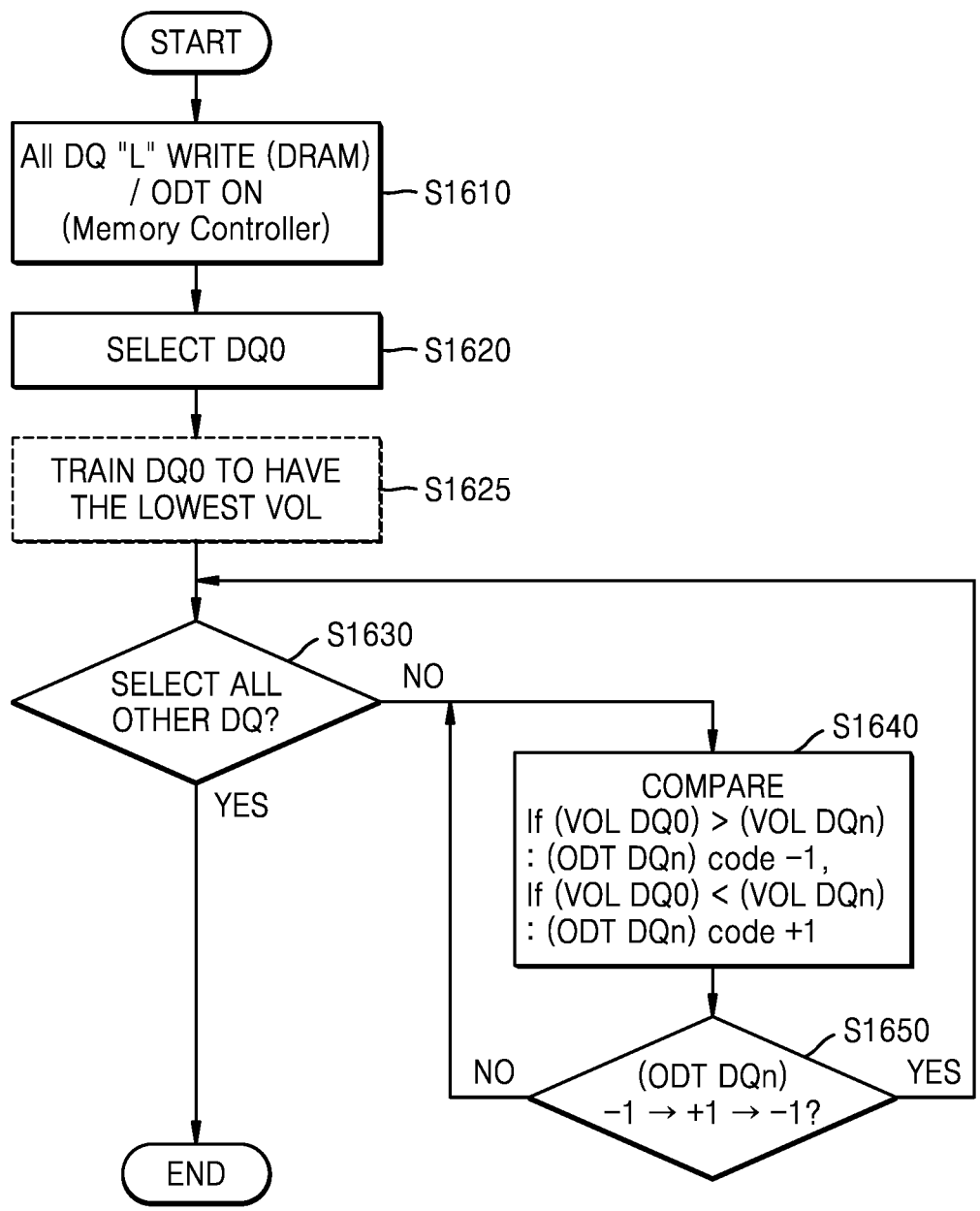
Figure 17:
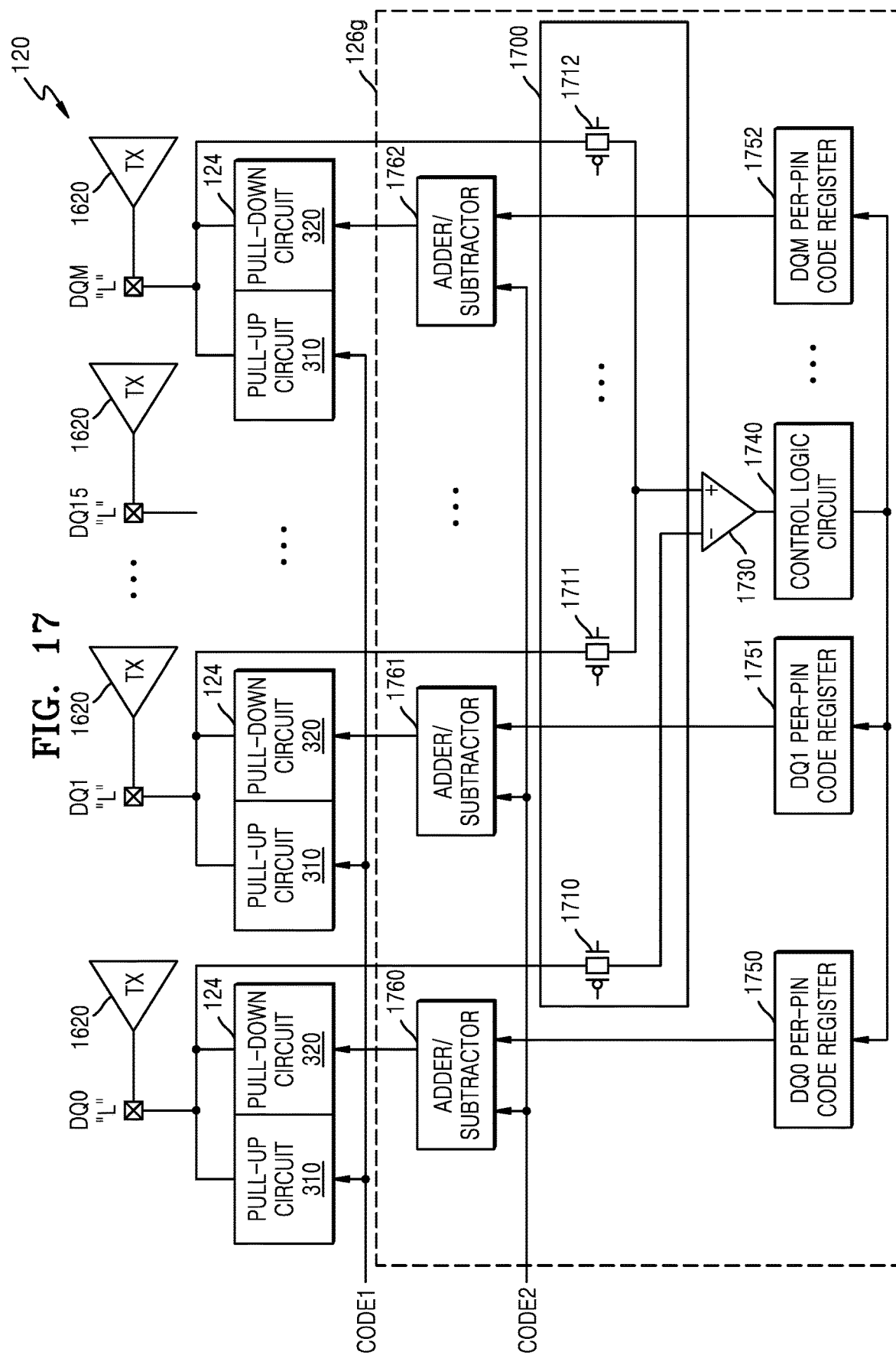
Figure 18:
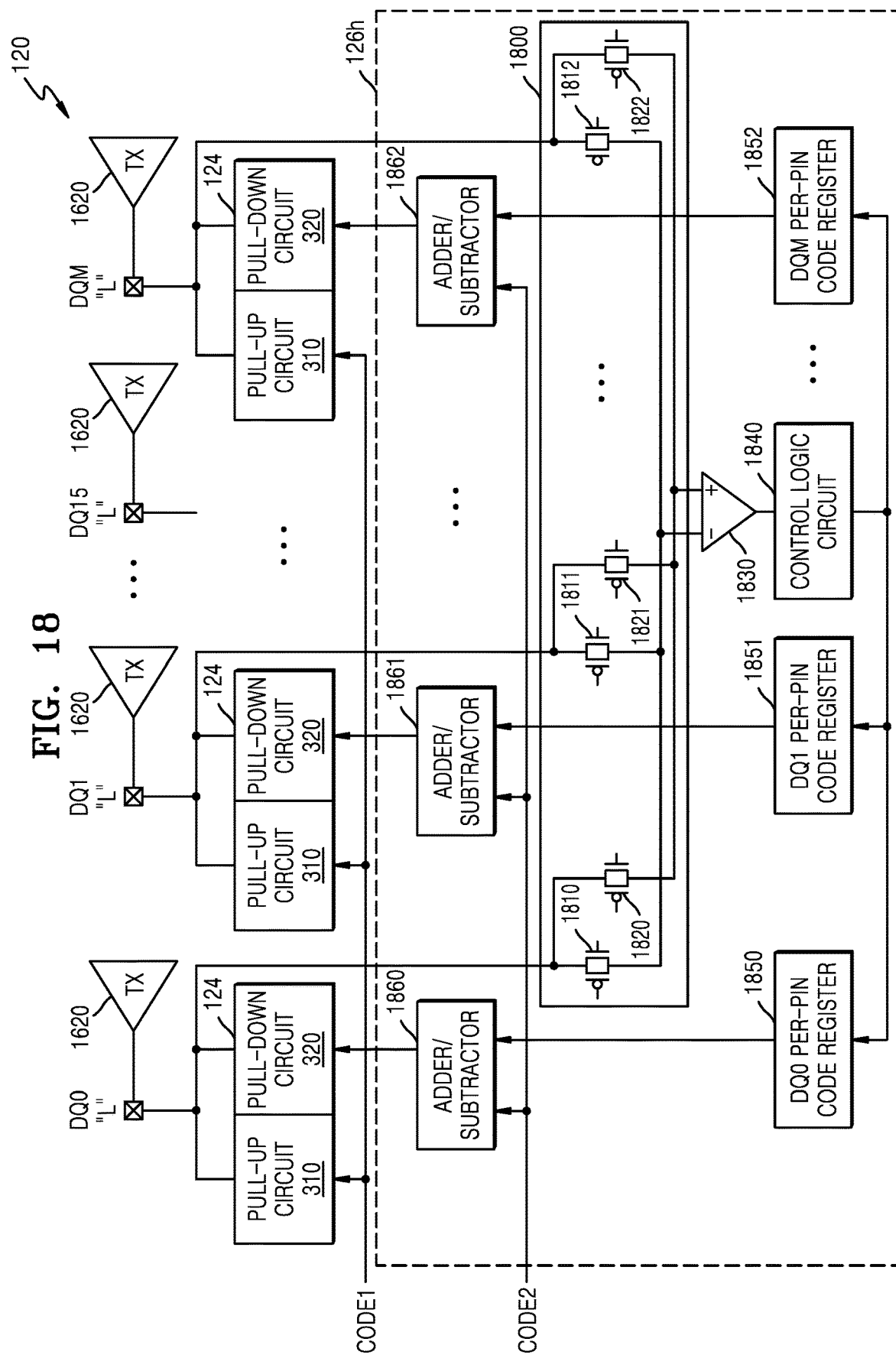

FIGS. 16A to 18 are diagrams illustrating output low level (VOL) parameters of a memory device according to some embodiments. FIG. 16A illustrates the concept of a VOL parameter of DQ data output by the memory device 120, and FIG. 16B is a flowchart illustrating a per-pin calibration operation on the VOL parameter of FIG. 16A. FIGS. 17 and 18 are diagrams illustrating per-pin calibration circuits 126g and 126h performing the per-pin calibration operation of FIG. 16B.

Referring to FIGS. 1 to 3 and 16A, to satisfy the VOL specification between the memory controller 110 and the memory device 120, each of the RCW 111 and the MRS 121 may store an output driver impedance parameter of the memory controller 110 and the memory device 120. A transmitter 1620 of the memory device 120 and a receiver 1610 of the memory controller 110 may be connected to each other through the DQ line 130. The memory controller 110 may include an ODT circuit 114d connected to the DQ line 130, and the ODT circuit 114d may be configured as a pull-up circuit connected to the power supply voltage VDDQ line. The ODT circuit 114d may include the pull-up switch SU disposed to correspond to the pull-up resistor RU connected between the ground voltage VSSQ line and the DQ line 130, and when the pull-up switch SU is turned on by the first code signal CODE1, the ODT circuit 114d may be ODT enabled.

The memory device 120 may include an ODT circuit 124d connected to the DQ line 130, and the ODT circuit 124d may be configured as a pull-down circuit connected to the ground voltage VSSQ line. The ODT circuit 124d may include the pull-down switch SD disposed to correspond to the pull-down resistor RD connected between the ground voltage VSSQ line and the DQ line 130, and when the pull-down switch SD is turned off by the second code signal CODE2, the ODT circuit 124c may be ODT disabled.

During a read operation of the memory device 120, the transmitter 1620 of the memory device 120 may transmit the logic low level data DQ to the memory controller 110 through the DQ line 130. At this time, the ODT circuit 124d of the memory device 120 may be ODT disabled. In the memory controller 110, the ODT circuit 114d may be terminated with the same ODT resistance value as the output driver impedance of the memory device 120 so that the receiver 1610 receives the data DQ of the VOL transmitted through the DQ line 130. Because the output driver impedance of the memory device 120 and the ODT resistance value of the receiver of the memory controller 110 are the same, the VOL specification of the DQ pin may be satisfied.

However, the memory device 120 includes a plurality of DQ pins, and the DQ pins may have VOL parameter value distributions according to their respective environments (e.g., circuit device characteristics and arrangement) and characteristics of the transmitter 1620 of the memory device 120, the DQ line 130, and/or the ODT circuit 114d of the memory controller 110. To reduce the VOL parameter value distribution of the plurality of DQ pins, the per-pin calibration operation of FIG. 16B may be performed.

Referring to FIG. 16B, a logic low level may be provided to all of the DQ pins DQ0, DQ1, DQ15, and DQM by the memory device 120 (S1610). In addition, the ODT resistance value of each of the plurality of DQ pins DQ0, DQ1, DQ15, and DQM of the memory controller 110 may be set because the ODT circuit 114d is enabled (S1610).

The per-pin calibration circuit 126g of FIG. 17 may select the DQ0 pin from among the plurality of DQ pins DQ0, DQ1, DQ15, and DQM (S1620). The per-pin calibration circuit 126g may sequentially select the other DQ pins DQ1, DQ15, and DQM (S1630), and sequentially compare the VOL value of the DQ0 pin with the VOL value of each of the other DQ pins (S1640). The per-pin calibration circuit 126g may perform the comparison operation S1640 until the VOL value of each of the other DQ pins DQ1, DQ15, and DQM is almost the same as the VOL value of the DQ0 pin so that a dither condition in which a result of comparison oscillates to −1, +1, and −1 occurs (S1650). When the comparison operation S1640 reaches the dither condition, the per-pin calibration circuit 126g may store the per-pin ODT code signal of each of the DQ pins DQ0, DQ1, DQ15, and DQM in the MRS 121 and provide the per-pin ODT code signal to the memory controller 110.

The per-pin calibration circuit 126h of FIG. 18 may train the DQ0 pin to have the lowest VOL value (S1625). The per-pin calibration circuit 126h may sequentially select the other DQ pins DQ1, DQ15, and DQM (S1630), and sequentially compare the lowest VOL value of the DQ0 pin with the VOL value of each of the other DQ pins (S1640). The per-pin calibration circuit 126h may perform the comparison operation S1640 until the VOL value of each of the other DQ pins DQ1, DQ15, and DQM is almost the same as the lowest VOL value of the DQ0 pin so that a dither condition in which a result of comparison oscillates to −1, +1, and −1 occurs (S1650). When the comparison operation S1640 reaches the dither condition, the per-pin calibration circuit 126h may store the per-pin ODT code signal of each of the DQ pins DQ0, DQ1, DQ15, and DQM in the MRS 121 and provide the per-pin ODT code signal to the memory controller 110.

Figure 19:
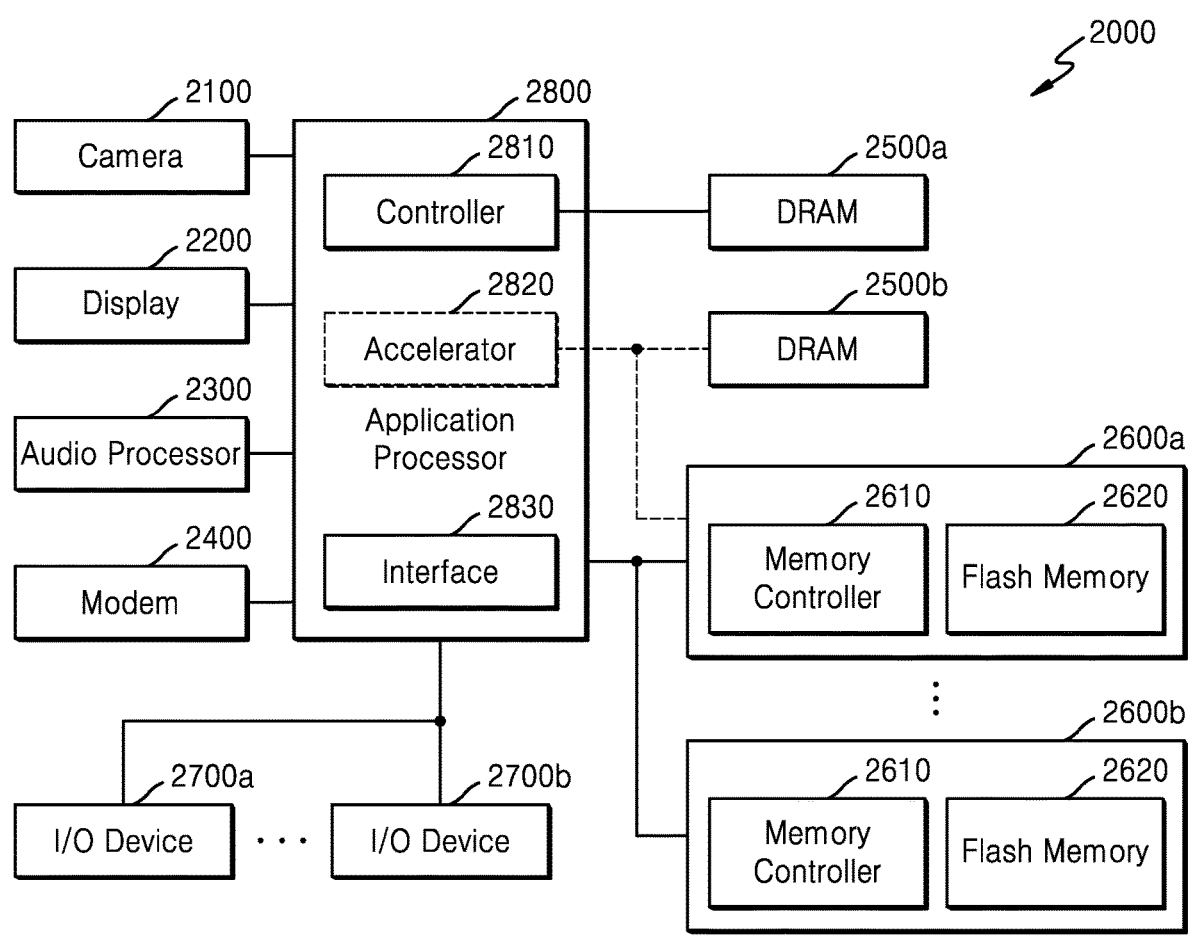
FIG. 19 is a block diagram of a system illustrating an electronic device including a memory device according to some embodiments.

FIG. 19 is a block diagram of a system 2000 illustrating an electronic device including a memory device according to some embodiments.

Referring to FIG. 19, the system 2000 may include a camera 2100, a display 2200, an audio processor 2300, a modem 2400, DRAMs 2500a and 2500b, flash memories 2600a and 2600b, I/O devices 2700a and 2700b, and an AP 2800. The system 2000 may be implemented as a laptop computer, a mobile phone, a smart phone, a tablet PC, a wearable device, a healthcare device, or an IoT device. Also, the system 2000 may be implemented as a server or a PC.

The camera 2100 may capture a still image or a moving image under the control of a user, and may store or transmit the captured image/image data to the display 2200. The audio processor 2300 may process audio data included in the flash memory devices 2600a and 2600b or network content. The modem 2400 may modulate and transmit a signal for transmission/reception of wired/wireless data, and may demodulate the signal to restore the original signal at the receiving side. The I/O devices 2700a and 2700b may include devices providing digital input and/or output functions such as universal serial bus (USB), storage, a digital camera, a secure digital (SD) card, a digital versatile disc (DVD), a network adapter, a touch screen, etc.

The AP 2800 may control overall operations of the system 2000. The AP 2800 may include a control block 2810, an accelerator block or accelerator chip 2820, and an interface block 2830. The AP 2800 may control the display 2200 to display part of the content stored in the flash memory devices 2600a and 2600b on the display 2200. When a user input is received through the I/O devices 2700a and 2700b, the AP 2800 may perform a control operation corresponding to the user input. The AP 2800 may include an accelerator block, which is a dedicated circuit for calculating artificial intelligence (AI) data, or may include an accelerator chip 2820 separate from the AP 2800. A DRAM 2500b may be additionally mounted on the accelerator block or the accelerator chip 2820. An accelerator is a functional block that specializes in performing a specific function of the AP 2800, and may include a GPU which is a block that specializes in graphic data processing, a neural processing unit (NPU) which is a functional block that specializes in AI calculation and inference, and a data processing unit (DPU) which is a block that specializes in data transfer.

The system 2000 may include the plurality of DRAMs 2500a and 2500b. The AP 2800 may communicate with the DRAMs 2500a and 2500b by controlling the DRAMs 2500a and 2500b through MRS settings conforming to the Joint Electron Device Engineering Council (JEDEC) standard, or setting DRAM interface protocols to use company-specific functions such as low voltage/high speed/reliability and cyclic redundancy check (CRC)/error correction code (ECC) functions. For example, the AP 2800 may communicate with the DRAM 2500a through an interface conforming to the JEDEC standard such as LPDDR4 and LPDDR5, and the accelerator block or the accelerator chip 2820 may communicate with the DRAM 2500b by setting a new DRAM interface protocol to control the DRAM 2500b for accelerator having a higher bandwidth than the DRAM 2500a.

FIG. 19 shows only the DRAMs 2500a and 2500b but embodiments of the inventive concept are not limited thereto, and when the bandwidth, response speed, and voltage conditions of the AP 2800 or the accelerator chip 2820 are satisfied, any memory such as PRAM, SRAM, MRAM, RRAM, FRAM, or hybrid RAM may be used. The DRAMs 2500a and 2500b have relatively smaller latency and bandwidth than the I/O devices 2700a and 2700b or the flash memories 2600a and 2600b. The DRAMs 2500a and 2500b may be initialized when the system 2000 is powered on, loaded with operating system and application data, and used as temporary storage for the operating system and the application data or used as an execution space for various software codes.

Addition/subtraction/multiplication/division operations, a vector operation, an address operation, or a fast Fourier transform (FFT) operation may be performed within the DRAMs 2500a and 2500b. In addition, a function for execution used for inference may be performed within the DRAMs 2500a and 2500b. Here, inference may be performed in a deep learning algorithm using an artificial neural network. The deep learning algorithm may include a training operation of training a model through various data and an inference operation of identifying or predicting data using the trained model. As an embodiment, an image captured by a user through the camera 2100 may be signal-processed and stored in the DRAM 2500b, and the accelerator block or the accelerator chip 2820 may perform an AI data operation of identifying data using data stored in the DRAM 2500b and the function for execution used for inference.

The system 2000 may include a plurality of storage or the plurality of flash memories 2600a and 2600b having a larger capacity than the DRAMs 2500a and 2500b. The accelerator block or the accelerator chip 2820 may perform the training operation and the AI data operation using the flash memories 2600a and 2600b. As an embodiment, the flash memories 2600a and 2600b may include a memory controller 2610 and a flash memory device 2620, and may more efficiently perform the training operation and the AI data operation performed by the AP 2800 and/or the accelerator chip 2820 using an operation unit included in the memory controller 2610. The flash memories 2600a and 2600b may store photos taken through the camera 2100 or data transmitted through a data network. For example, the flash memories 2600a and 2600b may store augmented reality/virtual reality, high definition (HD), or ultra high definition (UHD) content.

In the system 2000, the DRAMs 2500a and 2500b may include embodiments of the memory device described with reference to FIGS. 1 to 18. The memory device may perform a per-pin calibration operation to reduce signaling characteristic distributions (e.g., VIH, VIL, VOH, and VOL) of signal pins. The memory device may include a ZQ calibration circuit that performs a ZQ calibration operation and outputs a first code signal and a second code signal, a per-pin calibration circuit that outputs a per-pin ODT code signal of each of the signal pins, and an ODT circuit (or output driver circuit) and a MRS that receive first and second code signals correlated with the per-pin ODT code signal. The per-pin calibration circuit with respect to a VIH parameter may select the DQ0 pin from among the DQ pins DQ0, DQ1, DQ15, and DQM or train the DQ0 pin to have the lowest VIH value. The per-pin calibration circuit with respect to a VIH parameter may generate a per-pin ODT code signal by comparing the VIH value of the DQ0 pin with the VIH of each of the other DQn pins DQ1, DQ15, and DQM. The VIH value of each of the DQ pins DQ0, DQ1, DQ15, and DQM may be changed by the second code signal correlated with the per-pin ODT code signal, and when a dither condition in which a result of comparison between the VIH value of the DQ0 pin and the VIH value of each of the other DQn pins DQ1, DQ15, and DQM oscillates to −1, +1, and −1 occurs, the per-pin ODT code signal of each of the DQ pins DQ, DQ1, DQ15, and DQM may be stored in the corresponding per-pin code register. The per-pin ODT code signal stored in the per-pin code register may be stored in the MRS and provided to a memory controller. The per-pin calibration circuit with respect to a VOH parameter may select the DQ0 pin from among the DQ pins DQ0, DQ1, DQ15, and DQM or train the DQ0 pin to have the lowest VOH value. The per-pin calibration circuit with respect to the VOH parameter may generate a per-pin ODT code signal by comparing the VOH value of the DQ0 pin with the VOH value of each of the other DQn pins DQ1, DQ15, and DQM. The VOH value of each of the DQ pins DQ0, DQ1, DQ15, and DQM may be changed by the first code signal correlated with the per-pin ODT code signal, and when a dither condition in which a result of comparison between the VOH value of the DQ0 pin and the VOH value of each of the other DQn pins DQ1, DQ15, and DQM oscillates to −1, +1, and −1 occurs, the per-pin ODT code signal of each of the DQ pins DQ0, DQ1, DQ15, and DQM may be stored in the corresponding per-pin code register.

While the inventive concept has been particularly shown and described with reference to embodiments thereof, it will be understood that various changes in form and details may be made therein without departing from the spirit and scope of the following claims.

What is claimed is:

1. A memory device comprising:
a plurality of signal pins, each of the plurality of signal pins being connected to a receiver configured to receive a signal transmitted thereto;
a plurality of on-die termination (ODT) circuits configured to respectively provide an ODT resistance to each of the plurality of signal pins;
an impedance control (ZQ) calibration circuit configured to output a first code signal and a second code signal for controlling impedance of each of the plurality of signal pins, the first code signal and the second code signal being provided to the respective ODT circuits; and
a per-pin calibration circuit configured to select one signal pin from among the plurality of signal pins, to compare a first input voltage level of the selected signal pin with a second input voltage level of each of the other ones of the plurality of signal pins, to generate a per-pin ODT code signal for each of the plurality of signal pins, to combine the per-pin ODT code signal with the first code signal or the second code signal, and to provide the combined per-pin ODT code signal to the respective ODT circuits.

2. The memory device of claim 1, wherein the per-pin calibration circuit includes a per-pin code register configured to store the per-pin ODT code signal for each of the plurality of signal pins in a dither condition in which a result of comparison between the first input voltage level of the selected signal pin and the second input voltage level of each of the other ones of the plurality of signal pins oscillates between up and down.

3. The memory device of claim 1, further comprising: a mode register set (MRS) configured to store the per-pin ODT code signal.

4. The memory device of claim 1, wherein the first input voltage level and the second input voltage level are related to an input high level (VIH) parameter of each of the plurality of signal pins.

5. The memory device of claim 4, wherein the selected signal pin has a lowest VIH parameter value.

6. The memory device of claim 4, wherein each of the respective ODT circuits includes a pull-down circuit connected between each of the plurality of signal pins and a ground voltage, and the pull-down circuit is configured to provide the ODT resistance based on the second code signal.

7. The memory device of claim 6, wherein the per-pin calibration circuit includes an adder/subtractor configured to add or subtract the per-pin ODT code signal to or from the second code signal, and to provide a calculation result code of the adder/subtractor to the respective ODT circuits.

8. The memory device of claim 1, wherein the first input voltage level and the second input voltage level are related to an input low level (VIL) parameter of each of the plurality of signal pins.

9. The memory device of claim 8, wherein the selected signal pin has a lowest VIL parameter value.

10. The memory device of claim 8, wherein each of the respective ODT circuits includes a pull-up circuit connected between each of the plurality of signal pins and a power supply voltage, and the pull-up circuit is configured to provide the ODT resistance based on the first code signal.

11. The memory device of claim 10, wherein the per-pin calibration circuit includes an adder/subtractor configured to add or subtract the per-pin ODT code signal to or from the first code signal, and to provide a calculation result code of the adder/subtractor to the respective ODT circuits.

12. A memory device comprising:
a plurality of signal pins, each of the plurality of signal pins being connected to a transmitter configured to transmit a signal to a corresponding signal pin;
a plurality of on-die termination (ODT) circuits configured to respectively provide an output driver impedance to each of the plurality of signal pins;
an impedance control (ZQ) calibration circuit configured to output a first code signal and a second code signal for controlling the output driver impedance of each of the plurality of signal pins, the first code signal and the second code signal being provided to the respective ODT circuits; and
a per-pin calibration circuit configured to select one signal pin from among the plurality of signal pins, to compare a first output voltage level of the selected signal pin with a second output voltage level of each of the other ones of the plurality of signal pins, to generate a per-pin ODT code signal of each of the plurality of signal pins, to combine the per-pin ODT code signal with the first code signal or the second code signal, and to provide the combined per-pin ODT code signal to the respective ODT circuits.

13. The memory device of claim 12, wherein the per-pin calibration circuit includes a per-pin code register configured to store the per-pin ODT code signal for each of the plurality of signal pins in a dither condition in which a result of comparison between the first output voltage level of the selected signal pin and the second output voltage level of each of the other ones of the plurality of signal pins oscillates between up and down.

14. The memory device of claim 12, further comprising: a mode register set (MRS) configured to store the per-pin ODT code signal.

15. The memory device of claim 12, wherein the first output voltage level and the second output voltage level are related to an output high level (VOH) parameter of each of the plurality of signal pins.

16. The memory device of claim 15, wherein the selected signal pin has a lowest VOH parameter value.

17. The memory device of claim 15, wherein each of the respective ODT circuits includes a pull-up circuit connected between each of the plurality of signal pins and a power supply voltage, and the pull-up circuit is configured to provide the ODT resistance based on the first code signal.

18. The memory device of claim 17, wherein the per-pin calibration circuit includes an adder/subtractor configured to add or subtract the per-pin ODT code signal to or from the first code signal, and to provide a calculation result code of the adder/subtractor to the respective ODT circuits.

19. The memory device of claim 12, wherein the first output voltage level and the second output voltage level are related to an output low level (VOL) parameter of each of the plurality of signal pins, and
wherein the selected signal pin has the lowest VOL parameter value.

20. The memory device of claim 19, wherein each of the respective ODT circuits includes a pull-down circuit connected between each of the plurality of signal pins and a ground voltage, and the pull-down circuit is configured to provide the ODT resistance based on the second code signal, and,
wherein the per-pin calibration circuit includes an adder/subtractor configured to add or subtract the per-pin ODT code signal to or from the second code signal, and to provide a calculation result code of the adder/subtractor to the respective ODT circuits.

* * * * *